US009960065B2

(12) United States Patent
Kawasaki et al.

(10) Patent No.: US 9,960,065 B2
(45) Date of Patent: May 1, 2018

(54) SUBSTRATE PROCESSING APPARATUS FOR MANAGING TRANSFER STATE OF SUBSTRATE GAS STORAGE CONTAINER BASED ON SUPPLY FLOW RATE

(71) Applicant: Hitachi Kokusai Electric Inc., Tokyo (JP)

(72) Inventors: Junichi Kawasaki, Toyama (JP); Mitsuru Funakura, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 58 days.

(21) Appl. No.: 14/318,333

(22) Filed: Jun. 27, 2014

(65) Prior Publication Data

US 2015/0000591 A1 Jan. 1, 2015

(30) Foreign Application Priority Data

Jun. 28, 2013 (JP) .................................. 2013-136197
May 26, 2014 (JP) .................................. 2014-108161

(51) Int. Cl.
*H01L 21/673* (2006.01)
*H01L 21/67* (2006.01)
(Continued)

(52) U.S. Cl.
CPC .... *H01L 21/67393* (2013.01); *B05C 11/1002* (2013.01); *H01L 21/67253* (2013.01);
(Continued)

(58) Field of Classification Search
CPC ......... H01L 21/67393; H01L 21/67769; H01L 21/67775; H01L 21/67389; B05C 11/1026; B05C 11/1002
(Continued)

(56) References Cited

U.S. PATENT DOCUMENTS 5,912,043 A * 6/1999 Choi ...................... G03F 7/162
118/52
6,054,181 A * 4/2000 Nanbu .............. H01L 21/67173
427/240
(Continued)

FOREIGN PATENT DOCUMENTS

CN 10131004 A 11/2008
CN 103 125 012 A 5/2013
(Continued)

OTHER PUBLICATIONS

First Office Action, CN Patent Application No. 2014-10302788.1, 10 pages (English translation provided).
(Continued)

*Primary Examiner* — Karl Kurple
(74) *Attorney, Agent, or Firm* — Volpe and Koenig, P.C.

(57) ABSTRACT

Provided are a substrate processing apparatus, a method of manufacturing a semiconductor device, and a non-transitory computer-readable recording medium, which are capable of reducing an effect on a substrate, which is caused by a change in an atmosphere in a substrate storage container, by appropriately supplying an inert gas into the substrate storage container. The substrate processing apparatus includes a purge mechanism installed in at least one of a support unit and a receiving unit accommodating a substrate storage container, and configured to supply an inert gas into the substrate storage container; a monitoring unit configured to compare a flow rate of the predetermined gas supplied into the substrate storage container via the purge mechanism with a preset reference value and output a signal indicating a result of comparison between the flow rate of the predetermined gas and the preset reference value; and a management unit configured to manage use of the substrate storage
(Continued)

container, based on the signal outputted from the monitoring unit.

11 Claims, 14 Drawing Sheets

(51) Int. Cl.
    *B05C 11/10* (2006.01)
    *H01L 21/677* (2006.01)

(52) U.S. Cl.
    CPC .. *H01L 21/67288* (2013.01); *H01L 21/67769* (2013.01); *H01L 21/67775* (2013.01); *B05C 11/1026* (2013.01)

(58) Field of Classification Search
    USPC ..... 141/94, 65; 422/110, 107, 119; 118/692, 118/708; 427/8; 72/81, 82, 84; 414/217
    IPC ............................. H01L 21/677; B65B 31/04
    See application file for complete search history.

(56) References Cited

U.S. PATENT DOCUMENTS

| | | | | |
|---|---|---|---|---|
| 6,267,158 B1* | 7/2001 | Saga | ................ | H01L 21/67253 141/65 |
| 6,279,377 B1* | 8/2001 | Cao | ................... | G01N 27/4175 204/401 |
| 6,287,023 B1* | 9/2001 | Yaegashi | ................. | G03D 5/06 355/30 |
| 6,652,219 B2* | 11/2003 | Davis | ............... | H01L 21/67126 414/806 |
| 7,592,178 B2* | 9/2009 | Ding | .................. | B01D 65/102 422/122 |
| 7,638,001 B2* | 12/2009 | Kawamura | ........... | H01L 21/316 118/319 |
| 7,654,291 B2* | 2/2010 | Miyajima | ......... | H01L 21/67017 141/4 |
| 8,286,674 B2* | 10/2012 | Wang | ............... | H01L 21/67359 141/66 |
| 2002/0124906 A1* | 9/2002 | Suzuki | ............. | H01L 21/67017 141/98 |
| 2005/0175775 A1* | 8/2005 | Shirley | .................. | G03F 7/162 427/240 |
| 2007/0110636 A1* | 5/2007 | Lee | ................... | H01L 21/67017 422/110 |
| 2007/0137646 A1* | 6/2007 | Weinstein | ............. | A61M 16/16 128/204.17 |
| 2008/0178119 A1* | 7/2008 | Nogami | ............. | G06F 3/04847 715/810 |
| 2008/0274288 A1 | 11/2008 | Kondo et al. | | |
| 2011/0059245 A1* | 3/2011 | Miyamoto | .......... | H01L 21/6715 427/345 |
| 2011/0220545 A1 | 9/2011 | Ra et al. | | |
| 2012/0083918 A1 | 4/2012 | Yamazaki | | |
| 2013/0180451 A1 | 7/2013 | Horiuchi | | |
| 2014/0112739 A1* | 4/2014 | Hirano | ............. | H01L 21/67017 414/217.1 |
| 2015/0000591 A1* | 1/2015 | Kawasaki | ......... | H01L 21/67253 118/695 |
| 2015/0168363 A1* | 6/2015 | Kondo | ............... | G01N 33/0039 73/30.01 |

FOREIGN PATENT DOCUMENTS

| | | |
|---|---|---|
| JP | 2000-0340641 A | 12/2000 |
| JP | 2009-049286 A | 3/2009 |
| JP | 2009-212282 A | 9/2009 |
| JP | 2010-182747 A | 8/2010 |
| JP | 2012-094822 A | 5/2012 |
| KR | 10-2007-0052449 A | 5/2007 |
| KR | 10-2012-0033991 A | 9/2012 |

OTHER PUBLICATIONS

Korean Notification of Reason of Refusal, KR Patent Application No. 10-2014-0076297, dated Apr. 26, 2016, 5 pages.
Taiwanese Notification of First Office Action, TW Application No. 10-3121234, dated Nov. 16, 2015, 7 pages (English translation provided).

\* cited by examiner

SUBSTRATE PROCESSING APPARATUS FOR MANAGING TRANSFER STATE OF SUBSTRATE GAS STORAGE CONTAINER BASED ON SUPPLY FLOW RATE

CROSS-REFERENCE TO RELATED PATENT APPLICATION

This U.S. non-provisional patent application claims priority under 35 U.S.C. § 119 of Japanese Patent Application No. 2013-136197 filed on Jun. 28, 2013, and Japanese Patent Application No. 2014-108161 filed on May 26, 2014, in the Japanese Patent Office, the entire contents of which are hereby incorporated by reference.

BACKGROUND OF THE INVENTION

1. Field of the Invention

The present invention relates to a substrate processing apparatus including a substrate storage container for accommodating a substrate, a method of manufacturing a semiconductor device, and a non-transitory computer-readable recording medium.

2. Description of the Related Art

Conventionally, a semiconductor manufacturing apparatus, which is a type of a substrate processing apparatus, performs a substrate processing process of processing a substrate (hereinafter referred to as a 'wafer') based on a recipe (process recipe) defining process conditions and sequences, as a process of manufacturing a device such as a dynamic random access memory (DRAM) or an integrated circuit (IC). In the substrate processing apparatus, a plurality of wafers are loaded into a process furnace in a state where the wafers are transferred to a substrate retainer (hereinafter referred to as a 'boat'), and predetermined processing is performed on the wafers. In this case, since the start and end of the processing are waiting for in a state where the wafers are transferred to the boat in a transfer chamber installed below the process furnace, the wafers may be influenced by oxygen ($O_2$) contained in the atmosphere before or after thermal processing is performed on the wafers. Accordingly, an $N_2$ substitute mechanism is installed in the transfer chamber to manage the concentration of oxygen ($O_2$) so as to be reduced to less than a predetermined level.

A substrate which is to be processed by the semiconductor manufacturing apparatus is accommodated in a front opening unified pod (FOUP) serving as a substrate storage container, and loaded into a support unit (hereinafter referred to as a 'loading port'). When the FOUP is used, since a wafer is transferred in an airtight state, the degree of cleanliness of the wafer may be maintained even when particles or the like are present in an ambient atmosphere.

However, although the FOUP serving as a substrate storage container is an airtight container, the FOUP does not have a performance to completely block the flow of external air therein or therefrom. Thus, even if the FOUP is loaded in a device in an ideal state (e.g., a state where the concentration of $O_2$ is a predetermined level or less), the concentration of the oxygen ($O_2$) increases as time goes by until the FOUP is unloaded from the device. Therefore, in order to constantly maintain the concentration of the oxygen ($O_2$) in the FOUP, purging needs to be performed using $N_2$ gas while the FOUP is placed in the device. For example, a system of supplying an inert gas when a FOUP is placed on a cassette shelf is disposed in Patent Document 1.

PRIOR ART DOCUMENT

Prior Document

1. Japanese Unexamined Patent Application Publication No. 2000-340641

SUMMARY OF THE INVENTION

To solve this problem, it is an object of the present invention to reduce an effect on a substrate, which is caused by a change in an atmosphere in a substrate storage container, by monitoring the flow rate of an inert gas supplied into the substrate storage container.

According to one aspect of the present invention, there is provided a substrate processing apparatus including a gas supply unit installed in a support unit or a receiving unit accommodating a substrate storage container, and configured to supply a predetermined gas into the substrate storage container; a monitoring unit configured to compare a flow rate of the predetermined gas supplied into the substrate storage container via the gas supply unit with a preset reference value and output a signal indicating a result of comparison between the flow rate of the predetermined gas and the preset reference value; and a management unit configured to manage a transfer state of the substrate storage container based on the signal outputted from the monitoring unit.

According to another aspect of the present invention, there is provided a method of manufacturing a semiconductor device, the method including a process of supplying a predetermined gas into substrate storage container via a gas supply unit installed in a support unit or a receiving unit; a process of comparing the flow rate of the predetermined gas supplied into the substrate storage container via the gas supply unit with a preset reference value, and outputting a signal indicating a result of comparison between the flow rate of the predetermined gas and the preset reference value; a process of managing a transfer state of the substrate storage container based on the output signal; and a process of transferring to a process chamber a substrate present in the substrate storage container, the transfer state of which is managed, and processing the substrate.

According to another aspect of the present invention, there is provided a non-transitory computer-readable recording medium recording a flow-rate monitoring program that causes a computer to execute a sequence of supplying a gas into a substrate storage container accommodated in a support unit or a receiving unit; a sequence of comparing a flow rate of the gas supplied into the substrate storage container with a preset reference value; a sequence of outputting a signal indicating a result of comparison between the flow rate of the gas and the preset reference value; and a sequence of indicating a transfer state of the substrate storage container based on the signal.

DETAILED DESCRIPTION OF THE PREFERRED EMBODIMENTS

One Embodiment of the Present Invention

An embodiment of the present invention will be described below.

(1) Structure of Substrate Processing System

Figure 1:
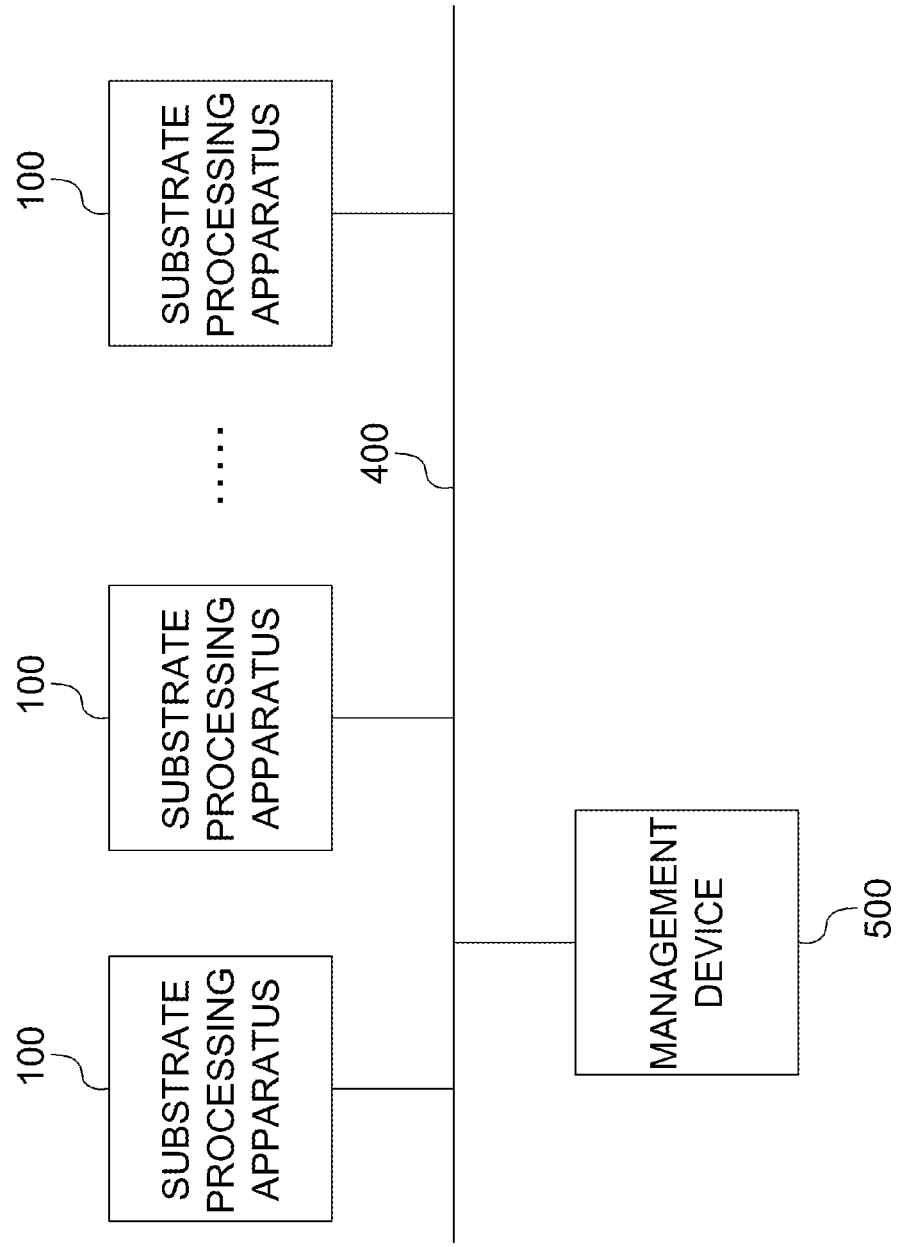
FIG. 1 is a schematic block diagram of the structure of a substrate processing system according to an embodiment of the present invention.

First, the structure of a substrate processing system according to an embodiment of the present invention will be described with reference to FIG. 1. FIG. 1 is a schematic block diagram of the structure of a substrate processing system according to an embodiment of the present invention.

As illustrated in FIG. 1, the substrate processing system according to the present embodiment includes at least one substrate processing apparatus 100, and a group management device 500 connected to the substrate processing apparatus 100 and configured to exchange data with to the substrate processing apparatus 100. The substrate processing apparatus 100 is configured to perform a processing process based on a recipe defining process conditions and sequences. The substrate processing apparatus 100 and the group management device 500 are connected via a network 400, for example, a local area network (LAN) or a wide area network (WAN).

(2) Structure of Substrate Processing Apparatus

Figure 2:
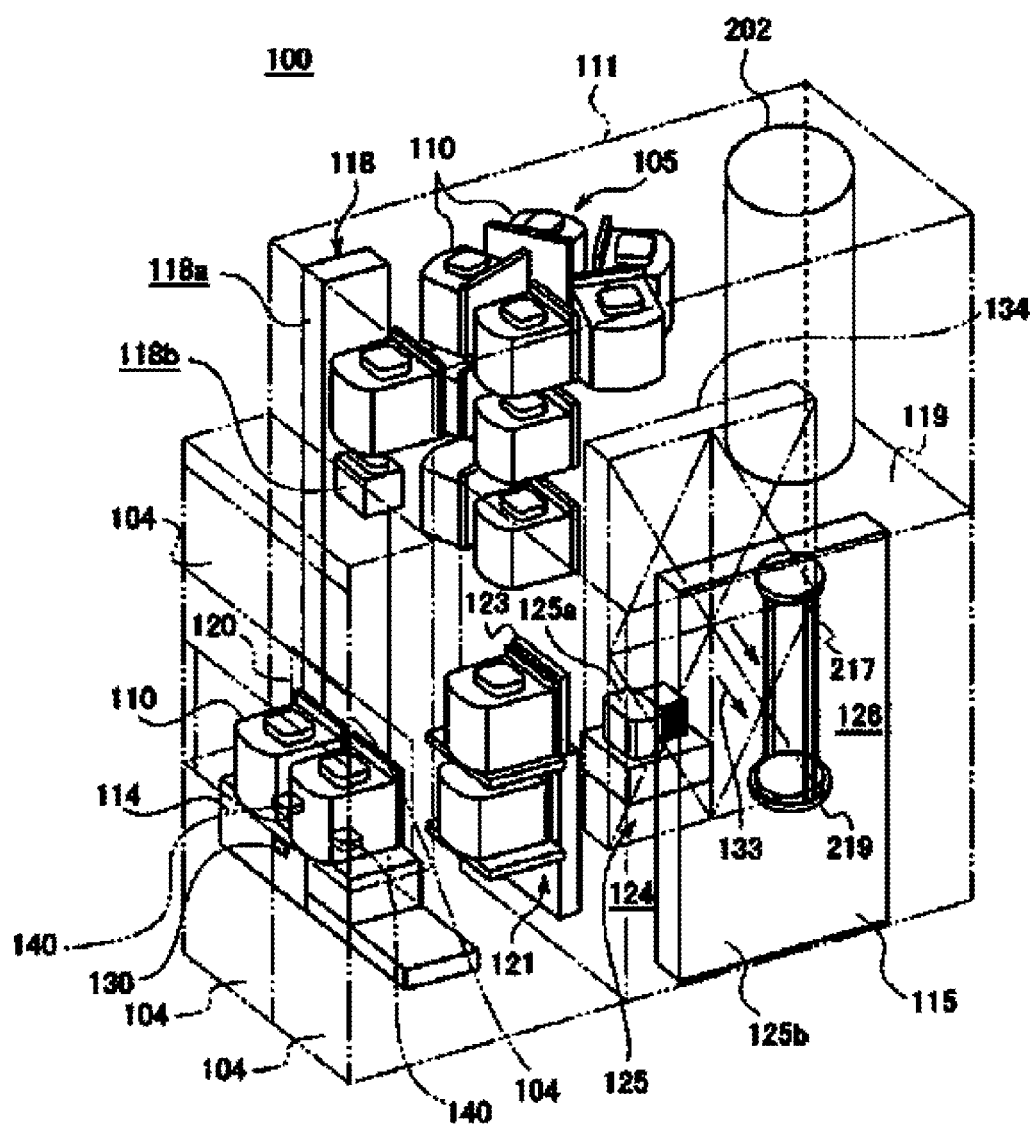
FIG. 2 is a perspective view of a substrate processing apparatus according to an embodiment of the present invention.
Figure 3:
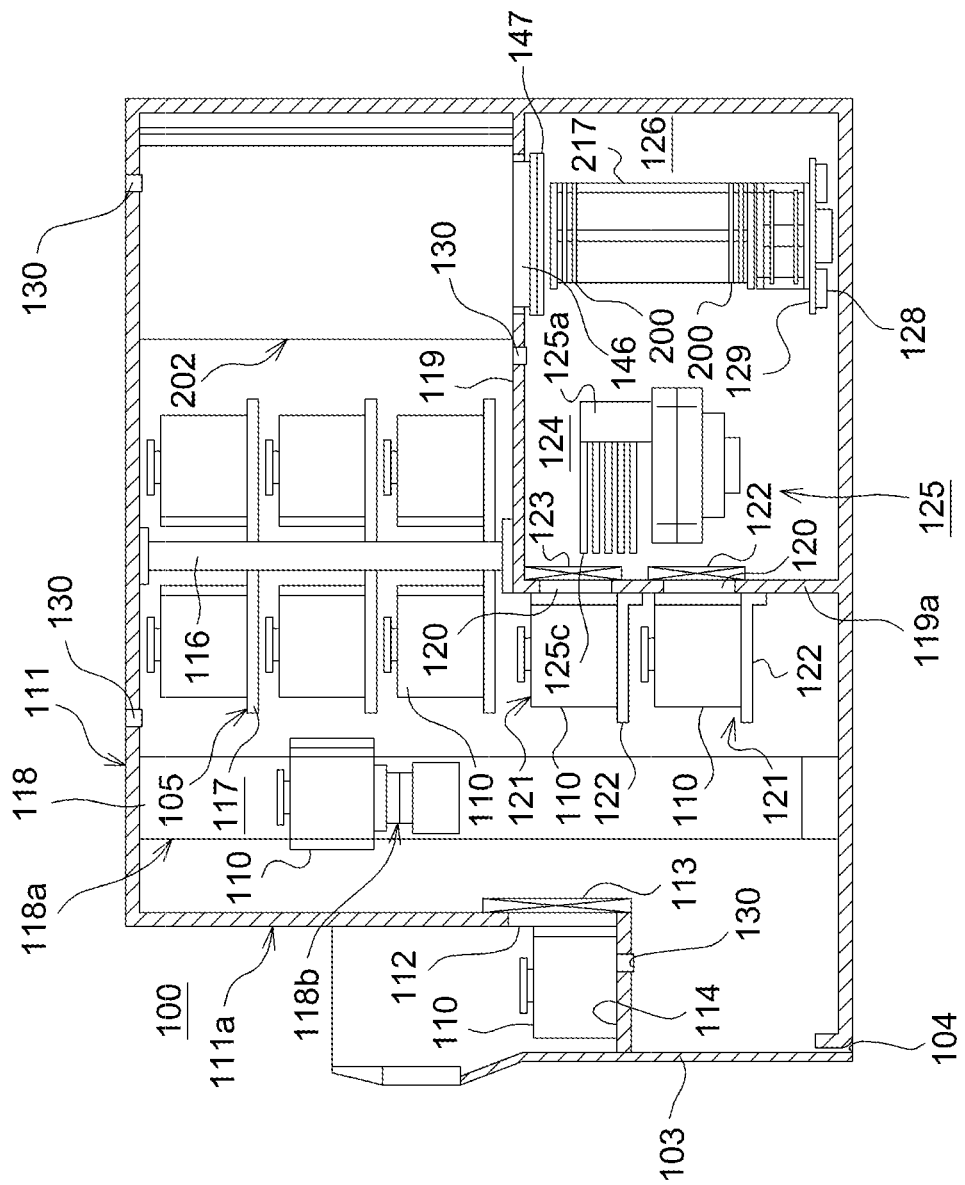
FIG. 3 is a side perspective view of a substrate processing apparatus according to an embodiment of the present invention.

Then, the structure of the substrate processing apparatus 100 according to the present embodiment will be described with reference to FIGS. 2 and 3. FIG. 2 is a perspective view of a substrate processing apparatus according to an embodiment of the present invention. FIG. 3 is a side perspective view of a substrate processing apparatus according to an embodiment of the present invention. Also, the substrate processing apparatus 100 according to the present embodiment is configured as, for example, a vertical device that performs an oxidation, a diffusion treatment, a chemical vapor deposition (CVD), etc., on a substrate such as a wafer.

As illustrated in FIGS. 2 and 3, the substrate processing apparatus 100 according to the present embodiment includes a housing 111 configured as a pressure-resistant container. At the front of a front wall 111a of the housing 111, a front maintenance opening 103 is formed as an opening through which maintenance may be performed. A pair of front maintenance doors 104 are installed as an entrance mechanism at the front maintenance opening 103 to open/close the front maintenance opening 103. A pod 110 (substrate storage container) accommodating a wafer 200 (substrate) formed of silicon or the like is used as a carrier for loading the wafer 200 into or unloading the wafers 200 from the housing 111.

On the front wall 111a of the housing 111, a pod loading/unloading port (substrate storage container loading/unloading port) 112 is installed to communicate with the inside/outside of the housing 111. The pod loading/unloading port 112 is configured to be opened/closed by a front shutter (substrate storage container loading/unloading port opening/closing mechanism) 113. A loading port (substrate storage container receiving support) 114 is installed as a support unit at the front of the pod loading/unloading port 112. The loading port 114 is configured to transfer and place the pod 110 thereon. The pod 110 is configured to be transferred onto the loading port 114 by an in-process transfer device (not shown) such as an overhead hoist transport (OHT).

A rotary pod shelf (substrate storage container support unit) 105 serving as a receiving unit is installed upward on a roughly central portion between the front and back of the housing 111. The rotary pod shelf 105 is configured to store a plurality of pods 110 thereon. The rotary pod shelf 105 includes a pillar 116 that is installed vertically and rotated intermittently within a horizontal plane, and a plurality of shelf boards 117 (substrate storage container placing supports) supported in a radial form at upper, middle, and lower ends of the pillar 116. The plurality of shelf boards 117 are configured to retain a plurality of pods 110, respectively, in a state where the pods 110 are placed thereon.

In the housing 111, a pod transfer device (substrate storage container transfer device) 118 is installed as a first transfer device between the loading port 114 and the rotary pod shelf 105. The pod transfer device 118 includes a pod elevator (substrate storage container lifting mechanism) 118a that may be moved vertically while retaining the pod 110 therein, and a pod transferring mechanism (substrate storage container transferring mechanism) 118b serving as a transferring mechanism. The pod transfer device 118 is configured to transfer the pod 110 between the loading port 114, the rotary pod shelf 105, and pod openers 121 (a substrate storage container lid opening/closing mechanism) through continuous operations of the pod elevator 118a and the pod transferring mechanism 118b.

A sub-housing 119 is installed at a lower portion in the housing 111, ranging from a roughly central portion between the front and back of the housing 111 to a rear end of the housing 111. A pair of wafer loading/unloading ports (substrate loading/unloading ports) 120 configured to transfer the wafer 200 inside/outside the sub-housing 119 are vertically installed on upper and lower ends of a front wall 119a of the sub-housing 119. The pod openers 121 are installed at the wafer loading/unloading ports 120 on the upper and lower ends of the front wall 119a, respectively.

The pod openers 121 each include one of a pair of placing tables 122 on which the pod 110 is placed, and one of a pair of cap attaching/detaching mechanisms (lid attaching/detaching mechanisms) 123 for attaching/detaching a cap (lid) of the pod 110. Each of the pod openers 121 is configured to open/close a wafer entrance of the pod 110 by attaching/detaching the cap of the pod 110 placed on the placing table 122 with the cap attaching/detaching mechanism 123.

In the sub-housing 119, a transfer chamber 124 is formed to be fluidically insulated from a space in which the pod transfer device 118 or the rotary pod shelf 105 is installed. A wafer transferring mechanism (substrate transferring mechanism) 125 is installed in a front region of the transfer chamber 124. The wafer transferring mechanism 125 includes a wafer transfer device (substrate transfer device) 125a configured to horizontally rotate or linearly move the wafer 200, and a wafer transfer device elevator (substrate transfer device lifting mechanism) 125b configured to move the wafer transfer device 125a upward/downward. As illustrated in FIG. 2, the wafer transfer device elevator 125b is installed between a front right end of the transfer chamber 124 in the sub-housing 119 and a right end of the housing 111. The wafer transfer device 125a includes tweezers (substrate retainer) 125c serving as a wafer support unit. Through continuous operations of the wafer transfer device elevator 125b and the wafer transfer device 125a, the wafer 200 may be loaded on a boat 217 (substrate retainer) (wafer charging) and unloaded from the boat 217 (wafer discharging).

A waiting station 126 is installed in a region at the back of the transfer chamber 124 to accommodate the boat 217 that waits to be processed. A process furnace 202 is installed above the waiting station 126. A bottom end portion of the process furnace 202 is configured to be opened/closed by a furnace port shutter (furnace port opening/closing mechanism) 147.

As illustrated in FIG. 2, a boat elevator (substrate retainer lifting mechanism) 115 is installed between a right end of the waiting station 126 of the sub-housing 119 and a right end of the housing 111 to move the boat 217 upward/downward. An arm 128 serving as a connector is connected to a lifting platform of the boat elevator 15. A seal cap 219 is horizontally installed as a lid on the arm 128. The seal cap 219 is configured to vertically support the boat 217 to block the bottom end portion of the process furnace 202.

A substrate transfer system according to the present embodiment mainly includes the rotary pod shelf 105, the boat elevator 115, the pod transfer device (substrate storage container transfer device) 118, the wafer transferring mechanism (substrate transferring mechanism) 125, the boat 217, and a rotation mechanism 254 which will be described below. The rotary pod shelf 105, the boat elevator 115, the pod transfer device (substrate storage container transfer device) 118, the wafer transferring mechanism (substrate transferring mechanism) 125, the boat 217, and the rotation mechanism 254 are electrically connected to a transfer controller 11.

The boat 217 includes a plurality of retaining members. The boat 217 is configured to horizontally retain a plurality of wafers 200 (e.g., 50 to 125 wafers 200) in a state where the wafers 200 are vertically arranged in a concentric form.

As illustrated in FIG. 2, a clean unit 134 is installed at a side of the transfer chamber 124 facing the wafer transfer device elevator 125b and a left end of the transfer chamber 124 opposite the boat elevator 115. The clean unit 134 includes a supply fan and a dustproof filter to supply clean air 133 which is a clean atmosphere or an inert gas. A notch alignment device (not shown) serving as a substrate matching device for adjusting the location of the wafer 200 in a circumferential direction is installed between the wafer transfer device 125a and the clean unit 134.

The clean air 133 blown out of the clean unit 134 circulates around the notch alignment device, the wafer transfer device 125a, and the boat 217 in the waiting station 126, is absorbed by a duct (not shown) to be exhausted outside the housing 111 or is circulated to a first side (supply side) which is an absorbing side of the clean unit 134, and is then blown out to the transfer chamber 124 again via the clean unit 134

Also, a plurality of device covers (not shown) serving as an entrance mechanism into the substrate processing apparatus 100 are installed on circumferential surfaces of the housing 111 and the sub-housing 119. The device covers are configured to be removed during maintenance so that a maintenance engineer can access the inside of the substrate processing apparatus 100. A door switch 130 is installed as an entrance sensor on each of ends of the housing 111 and the sub-housing 119 facing the device covers. Also, a door switch 130 is installed as an entrance sensor on an end of the housing 111 facing the front maintenance door 104. A substrate detection sensor 140 is installed on the loading port 114 to detect whether the pod 110 is placed on the loading port 114. Various types of switches and sensors (not shown), such as the door switches 130 and the substrate detection sensor 140, are electrically connected to a controller 240 for use in a substrate processing apparatus which will be described below.

(3) Operation of Substrate Processing Apparatus

Next, an operation of the substrate processing apparatus 100 according to the present embodiment will be described with reference to FIGS. 2 and 3.

As illustrated in FIGS. 2 and 3, when the pod 110 is provided to the loading port 114 via an in-process transfer device (not shown), the pod 110 is detected by the substrate detection sensor 140 and the pod loading/unloading port 112 is opened by the front shutter 113. Then, the pod 110 provided on the loading port 114 is loaded into the housing 111 by the pod transfer device 118 via the pod loading/unloading port 112.

The pod 110 loaded into the housing 111 is automatically transferred to and temporarily stored in the shelf board 117 of the rotary pod shelf 105 by the pod transfer device 118. Then, the pod 110 is transferred from the shelf board 117 to the placing table 122 of one of the pod openers 121. Also, the pod 110 loaded into the housing 111 may be directly transferred onto the placing table 122 of the pod opener 121 by the pod transfer device 118. In this case, the wafer loading/unloading port 120 of the pod opener 121 is closed by the cap attaching/detaching mechanism 123, and the clean air 133 is circulated in the transfer chamber 124 to fill the transfer chamber 124 with the clean air 133. For example, the concentration of oxygen in the transfer chamber 124 is set to be, for example, 20 ppm or less by filling the inside of the transfer chamber 124 with the clean air 133, e.g., nitrogen gas, so that the concentration of oxygen in the transfer chamber 124 may be far less than the concentration of oxygen in an atmosphere in the housing 111.

When an end surface, of the pod 110 placed on the placing table 122 facing an opening is pressurized onto an edge portion of the wafer loading/unloading port 120 near the opening at the front wall 119a of the sub-housing 119, the cap of the pod 110 is removed by the cap attaching/detaching mechanism 123 to open a wafer entrance. Then, the wafer 200 is picked up from the inside of the pod 110 via the wafer entrance by the tweezers 125c of the wafer transfer device 125a, the direction of the wafer 200 is adjusted by the notch alignment device, and then the wafer 200 is loaded into the waiting station 126 at the back of the transfer chamber 124 to be loaded (charged) into the boat 217. After loading the wafer 200 into the boat 217, the wafer transfer device 125a returns to the pod 110 to load a next wafer 200 into the boat 217.

While the wafer 200 is loaded into the boat 217 by the wafer transferring mechanism 125 using one of the pod openers 121 (the pod opener 121 on the upper or lower end of the front wall 119a), another pod 110 is transferred to and placed on the placing table 122 of the other pod opener 121 from the rotary pod shelf 105 by the pod transfer device 118 and is opened by the other pod opener 121.

When a predetermined number of the wafers 200 are loaded into the boat 217, the lower end portion of the process furnace 202 closed by the furnace port shutter 147 is opened by the furnace port shutter 147. Then, the boat 217 retaining the predetermined number of the wafers 200 is loaded into the process furnace 202 as the seal cap 219 is moved upward by the boat elevator 115.

After the loading of the boat 217, arbitrary processing is performed on the wafers 200 in the process furnace 202. Then, the boat 217 storing the processed wafers 200 is unloaded from a process chamber 201 and the pod 110 storing the processed wafers 200 is unloaded from the housing 111 in an order substantially opposite the above-described order, except for a wafer matching process performed by the notch alignment device.

(4) Structure of Process Furnace

Figure 4:
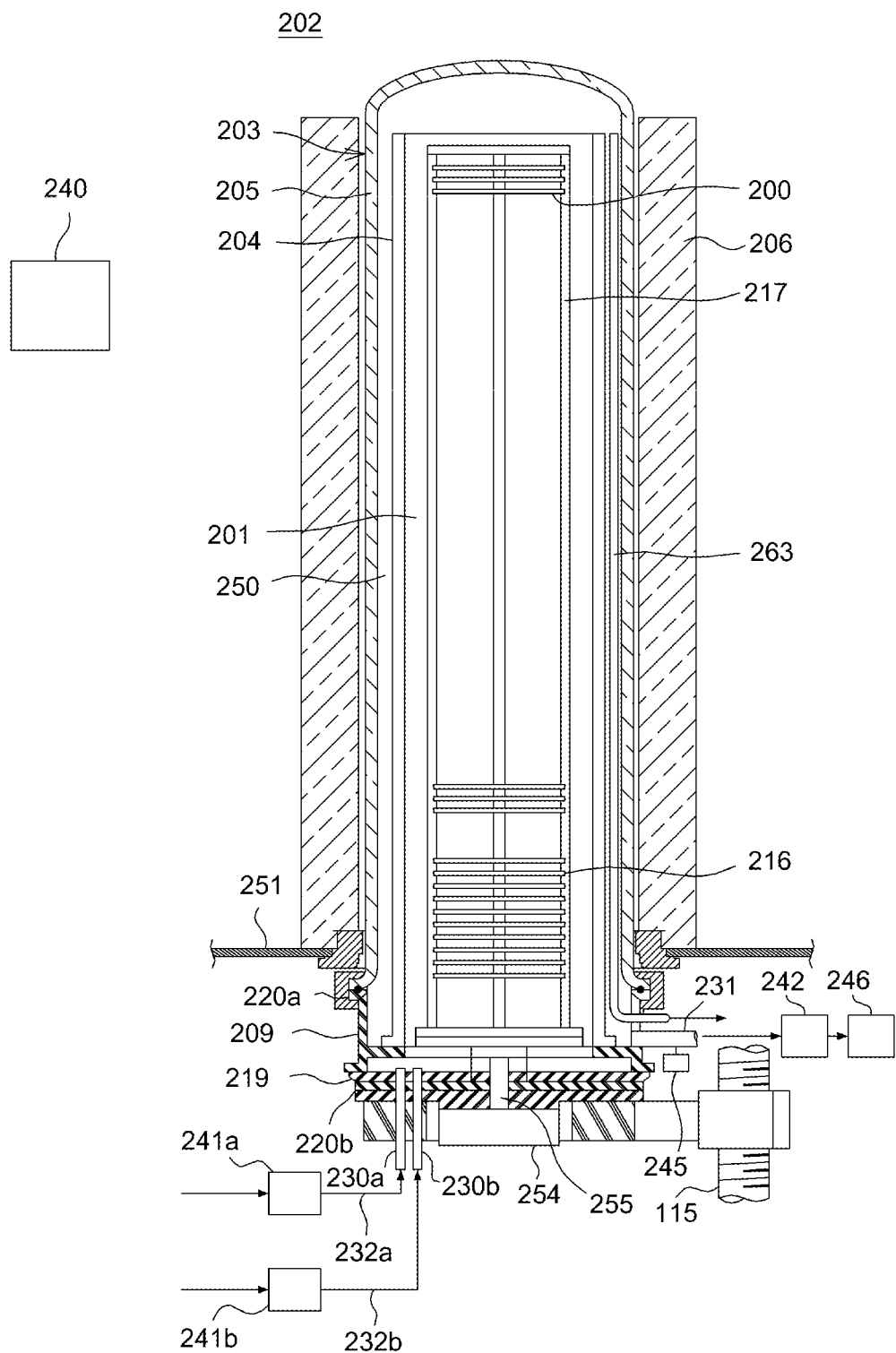
FIG. 4 is a vertical cross-sectional view of a process furnace of a substrate processing apparatus according to an embodiment of the present invention.

Then, the structure of the process furnace 202 according to the present embodiment will be described with reference to FIG. 4. FIG. 4 is a vertical cross-sectional view of the process furnace 202 of the substrate processing apparatus 100 according to an embodiment of the present invention.

As illustrated in FIG. 4, the process furnace 202 includes a process tube 203 as a reaction tube. The process tube 203 includes an inner tube 204 as an inner reaction tube, and an outer tube 205 as an outer reaction tube installed at an outer side of the inner tube 204. The inner tube 204 is formed of, for example, a heat-resistant material, e.g., quartz ($SiO_2$) or silicon carbide (SiC). The inner tube 204 has a cylindrical shape, the upper and lower ends of which are open. The process chamber 201 is formed in a hollow tubular portion of the inner tube 204, in which the wafers 200 as substrates are processed. The inside of the process chamber 201 is configured to accommodate the boat 217 which will be described below. The outer tube 205 is installed in a concentric form with the inner tube 204. The outer tube 205 has a cylindrical shape, the internal diameter of which is greater than an external diameter of the inner tube 204, the upper end of which is closed, and the lower end of which is open. The outer tube 205 is formed of, for example, a heat-resistant material, e.g., quartz ($SiO_2$) or silicon carbide (SiC).

A heater 206 serving as a heating mechanism is installed at an outer side of the process tube 203 to surround sidewall surfaces of the process tube 203. The heater 206 has a cylindrical shape. The heater 206 is vertically installed by being supported by a heater base 251 as a retaining plate.

A manifold 209 is installed below the outer tube 205 to be concentrically formed with the outer tube 205. The manifold 209 is formed of, for example, stainless steel or the like. The manifold 209 has a cylindrical shape, the top and bottom ends of which are open. The manifold 209 is engaged with a lower end portion of the inner tube 204 and a lower end portion of the outer tube 205. The manifold 209 is installed to support the lower end portion of the inner tube 204 and the lower end portion of the outer tube 205. Also, an O-ring 220a serving as a seal member is installed between the manifold 209 and the outer tube 205. By supporting the manifold 209 with the heater base 251, the outer tube 205 is vertically installed. The process tube 203 and the manifold 209 form a reaction container together.

A process gas nozzle 230a and a purge gas nozzle 230b are connected as gas introduction units to the seal cap 219 which will be described below to communicate with the inside of the process chamber 201. A process gas supply pipe 232a is connected to the process gas nozzle 230a. A process gas supply source (not shown) or the like is connected to an upstream side of a process gas supply pipe 232 (a side of the process gas supply pipe 232 opposite a side of the process gas supply pipe 232 connected to the process gas nozzle 230a) via a mass flow controller (MFC) 241a serving as a gas flow rate controller. Also, a purge gas supply pipe 232b is connected to a purge gas nozzle 230b. A purge gas supply source (not shown) or the like is connected to an upstream side of the purge gas supply pipe 232b (a side of the purge gas supply pipe 232b opposite a side of the purge gas supply pipe 232b connected to the purge gas nozzle 230b) via an MFC 241b serving as a gas flow rate controller.

A process gas supply system according to the present embodiment mainly includes the process gas supply source, the MFC 241a, the process gas supply pipe 232a, and the process gas nozzle 230a. The purge gas supply system according to the present embodiment mainly includes the purge gas supply source, the MFC 241b, the purge gas supply pipe 232b, and the purge gas nozzle 230b. A gas supply system according to the present embodiment mainly includes the process gas supply system and the purge gas supply system. A gas supply controller 14 is electrically connected to the MFCs 241a and 241b. Also, the gas supply controller 14 is connected as a monitoring unit to a purge mechanism which will be described below, and configured to monitor an amount of an inert gas supplied into the substrate storage container 110 to perform purging.

An exhaust pipe 231 is installed at the manifold 209 to exhaust an atmosphere from the process chamber 201. The exhaust pipe 231 is disposed at a lower end portion of a cylindrical space 250 formed by a gap between the inner tube 204 and the outer tube 205. The exhaust pipe 231 communicates with the cylindrical space 250. A pressure sensor 245 serving as a pressure detector, a pressure adjustment device 242 configured, for example, as an auto pressure controller (APC), and a vacuum exhaust device 246 such as a vacuum pump are sequentially connected to a downstream side of the exhaust pipe 231 (a side of the exhaust pipe 231 opposite a side of the exhaust pipe connected to the manifold 209) from an upstream direction. A gas exhaust mechanism mainly includes the exhaust pipe 231, the pressure sensor 245, the pressure adjustment device 242, and the vacuum exhaust device 246. A pressure controller 13 is electrically connected to the pressure adjustment device 242 and the pressure sensor 245.

The seal cap 219 serving as a furnace port lid for an air-tightly seal of the lower end opening of the manifold 209 is installed below the manifold 209. The seal cap 219 is formed to vertically abut the lower end of the manifold 209 from a lower side thereof. The seal cap 219 is formed of a metal, for example, stainless steel. The seal cap 219 has a disc shape. An O-ring 220b serving as a sealing member that abuts the lower end of the manifold 209 is installed on an upper surface of the seal cap 219.

The rotation mechanism 254 is installed near a central portion of the seal cap 219 and at a side of the seal cap 219 opposite the process chamber 201 to rotate the boat 217. A rotation shaft 255 of the rotation mechanism 254 supports the boat 217 from below while passing through the seal cap 219. The rotation mechanism 254 is configured to rotate the wafer 200 by rotating the boat 217.

The seal cap 219 is configured to be moved vertically by the boat elevator 115 vertically installed as a substrate retainer lifting mechanism outside the process tube 203. By moving the seal cap 219 upward/downward, the boat 217 may be transferred inside or outside the process chamber 201. The transfer controller 11 is electrically connected to the rotation mechanism 254 and the boat elevator 115.

As described above, the boat 217 serving as a substrate retainer is configured to retain a plurality of the wafers 200 on multiple stages in a state where the wafers 200 are concentrically arranged in a horizontal posture. The boat 217 is formed of a heat-resistant material, e.g., quartz or silicon carbide. Below the boat 217, a plurality of insulating plates 216 serving as insulating members are arranged in a horizontal posture and on multiple stages. The insulating plates 216 have a disc shape. The insulating plates 216 are formed of a heat-resistant material, e.g., quartz or silicon carbide. The insulating plates 216 are configured to prevent heat generated from the heater 206 from being transferred to the manifold 209.

A temperature sensor 263 serving as a temperature detector is installed in the process tube 203. A heating mechanism according to the present embodiment mainly includes the heater 206 and the temperature sensor 263. A temperature controller 12 is electrically connected to the heater 206 and the temperature sensor 263.

A substrate process system according to the present embodiment mainly includes the gas exhaust mechanism, the gas supply system, and the heating mechanism.

(5) Operation of Process Furnace

Next, a method of forming a thin film on the wafer 200 by CVD using the process furnace 202 having the structure described above will be described below as a process included in a process of manufacturing a semiconductor device with reference to FIG. 4. In the following description, operations of various elements of the substrate processing apparatus 100 are controlled by the controller 240 for use in a substrate processing apparatus.

When the plurality of wafers 200 are loaded into the boat 217 (wafer charging), the boat 217 retaining the wafers 200 is lifted by the boat elevator 115 and is then loaded into the process chamber 201 (boat loading) as illustrated in FIG. 4. In this state, the lower end of the manifold 209 is hermetically sealed by the seal cap 219 via the O-ring 220b.

The inside of the process chamber 201 is vacuum-exhausted by the vacuum exhaust device 246 to have a desired pressure (degree of vacuum). In this case, the pressure adjustment device 242 (the degree of opening a valve of the pressure adjustment device 242) is feedback-controlled based on a pressure measured by the pressure sensor 245. Also, the inside of the process chamber 201 is heated to a desired temperature by the heater 206. In this case, the amount of current to be supplied to the heater 206 is feedback-controlled based on temperature information detected by the temperature sensor 263. Then, the boat 217 and the wafers 200 may be rotated by the rotation mechanism 254.

Next, a process gas supplied from the process gas supply source and controlled to have a desired flow rate by the MFC 241a circulates in the gas supply pipe 232a and is then introduced into the process chamber 201 via the process gas nozzle 230a. The introduced process gas moves upward in the process chamber 201, is discharged into the cylindrical space 250 from an upper opening of the inner tube 204, and is then exhausted via the exhaust pipe 231. When the process gas passes through the inside of the process chamber 201, the process gas contacts a surface of the wafer 200. In this case, a thin film is deposited on the surface of the wafers 200 by a thermal CVD reaction.

When a preset process time elapses, a purge gas supplied from the purge gas supply source and controlled to have a desired flow rate by the MFC 241b is supplied into the process chamber 201, and the pressure in the process chamber 201 is returned to normal pressure while the atmosphere in the process chamber 201 is replaced with an inert gas.

Then, the seal cap 219 is moved downward by the boat elevator 115 to open the lower end of the manifold 209 and to unload the boat 217 retaining the processed wafers 200 from the lower end of the manifold 209 to the outside of the process tube 203 (boat unloading). Then, the processed wafers 200 are discharged by the boat 217 (wafer discharging) and stored in the pod 110 (wafer discharging).

(6) Structure of Controller for Use in Substrate Processing Apparatus (Controller for Substrate Processing Apparatus)

Figure 5:
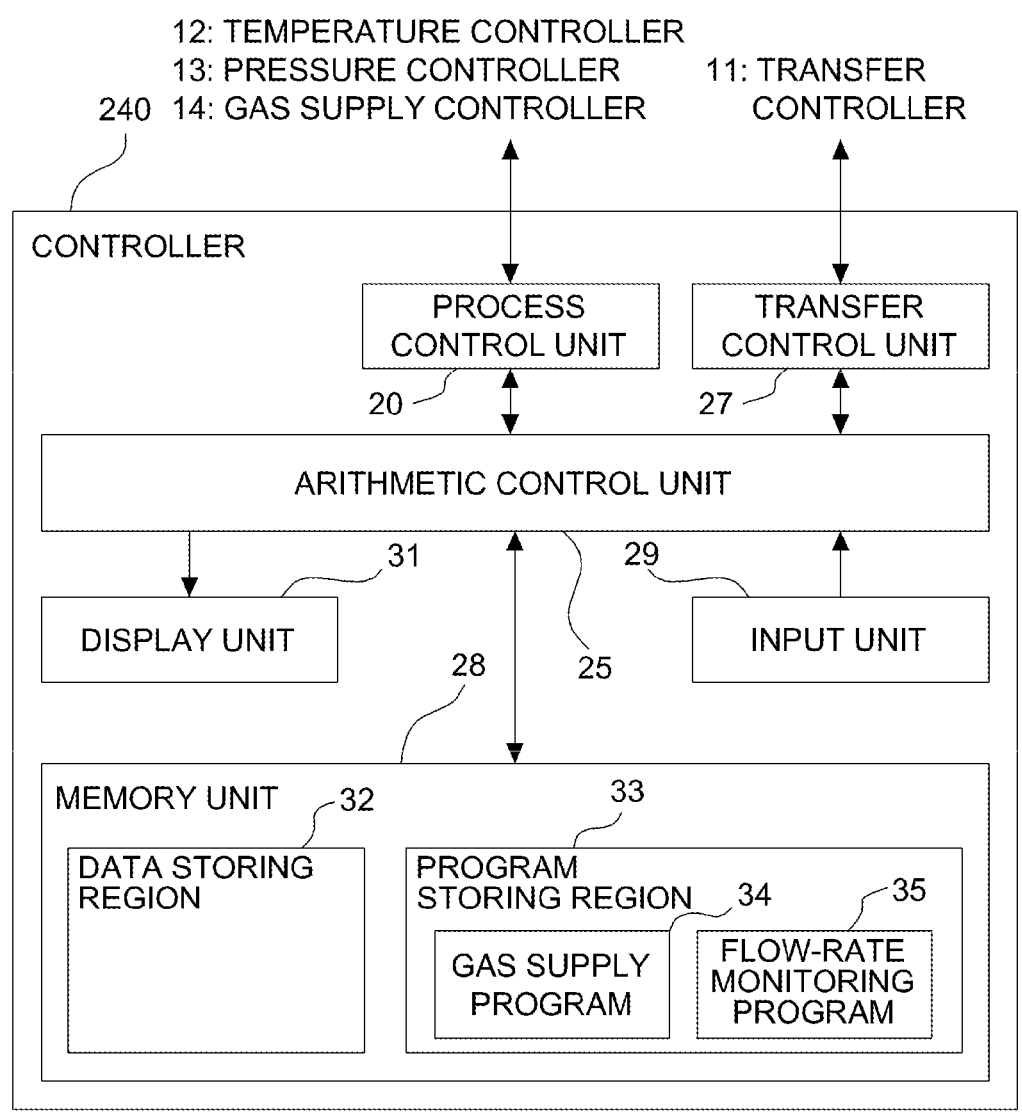
FIG. 5 is a block diagram of a controller of a substrate processing apparatus according to an embodiment of the present invention.

The controller 240 as a controller for use in a substrate processing apparatus will now be described with reference to FIG. 5.

The controller 240 mainly includes an arithmetic control unit 25 such as a central processing unit (CPU), a process control unit 20 as a process controller, a transfer control unit 27 as the transfer controller 11, a memory unit 28 including a memory or a hard disk drive (HDD), an input unit 29 such as a mouse or a keyboard, and a display unit 31 such as a monitor. A manipulation unit capable of setting various types of data may be configured by the arithmetic control unit 25, the memory unit 28, the input unit 29, and the display unit 31.

The CPU 25 forms the backbone of the controller 240 for use in a substrate processing apparatus, executes a control program stored in a read only memory (ROM) (not shown), and executes a recipe (e.g., a recipe for a process, such as a substrate process recipe) stored in the memory unit 28 embodied as, for example, a recipe memory unit according to an instruction from the display unit 31. The ROM may include an electrically erasable programmable ROM (EEPROM), a flash memory, a hard disc, etc., and may be a recording medium storing a program of operating the CPU 25. The memory (e.g., RAM) may function as a work area (temporary memory unit) of the CPU 25 or the like.

Here, the substrate process recipe defines process conditions or sequences for processing the wafers 200. Also, in a recipe file, either set values (control values), that are to be transmitted to the transfer controller 11, the temperature controller 12, the pressure controller 13, the gas supply controller 14, and the like, or a timing of transmitting the set values (control values) is set for each of steps of substrate processing.

Also, the controller 240 for use in a substrate processing apparatus according to an embodiment of the present invention may be embodied using not only a dedicated system but also a general computer system. For example, the controller 240 for use in a substrate processing apparatus, which is capable of performing the above-described processing, may be configured by installing a control program that causes a general-purpose computer to perform the above-described processing from an external recording medium (a flexible disc, a CD-ROM, a Universal Serial Bus (USB) memory, an external HDD, etc.) storing the control program which performs the above-described processing.

Any arbitrary means may be used to provide such a program. Such a program may be provided via a predetermined recording medium as described above, and may be also provided, for example, via a communication line, a communication network, a communication system, etc. In this case, the program may be posted, for example, on a bulletin board of a communication network and provided via the communication network by overlapping the program with a carrier wave. The above-described processing may be performed by starting the provided program to be executed under control of an operational system (OS), similar to other applications.

The process control unit 20 has a function of controlling the temperature or pressure in the process chamber 201, the flow rate of a process gas introduced into the process chamber 201, etc., so that predetermined processing may be performed on the wafers 200 loaded in the process chamber 201.

The transfer control unit 27 has a function of controlling driving of a transferring mechanism, such as the pod transfer device 118, the wafer transferring mechanism 125, the boat elevator 115, etc., using a driving motor (not shown).

In the memory unit 28, a data storage region 32 in which various types of data are stored, and a program storage region 33 in which various programs are stored are formed.

Various parameters related to the recipe file are stored in the data storage region 32. Also, information regarding a receiving location on the loading port 114 as an I/O stage when the pod 110 is loaded into or unloaded from the housing 111, sequences of an operation of moving the pod transfer device 118 as a carrier loader to the receiving location, sequences of an operation of moving the pod transfer device 118 as a carrier loader from the receiving location, and the like are stored in the data storage region 32. Also, carrier information at least including carrier identification (ID) information for identifying each of the pods 110 and information regarding the type of the wafers 200 in the pod 110 may be stored in the data storage region 32.

Various programs needed to load or unload the pod 110 are stored in the program storage region 33. For example, programs such as a gas supply program 34 for supplying an appropriate amount of an inert gas (e.g., $N_2$ gas) into the pods 110 except when the pods 110 are moved and a flow-rate monitoring program 35 for monitoring the supply rate of a gas in the pods 110 when the gas supply program 34 is run are stored in the program storage region 33. Also, the flow-rate monitoring program 35 is divided into a first flow-rate monitoring program and a second flow-rate monitoring program, and configured to be stored in the program storage region 33. Also, various types of data generated when the gas supply program 34 and the flow-rate monitoring program 35 are executed are stored in the data storage region 32. For example, data representing the relation between the flow rate of an inert gas supplied into the pod 110 and a time until a pod 110 in which purging is to be performed is loaded in and then unloaded from the substrate processing apparatus 100, a comparison result signal (comparison result information) indicating a result of comparison between the supply rate of the inert gas and a predetermined reference value [e.g., an alarm signal (alarm information) indicating a flow rate is in an abnormal state when the supply rate of the inert gas is less than or equal to the predetermined reference value, an alarm recovery signal (normality recovery information) indicating that the supply rate of the inert gas becomes greater than or equal to the predetermined reference value and is thus restored to a normal flow rate before a state where the supply rate of the inert gas is less than or equal to the predetermined reference value lasts for a predetermined time period], a fault indication signal (fault indication information) indicating a faulty state (whether a faulty FOUP is indicated or not) when the state where the supply rate of the inert gas is less than or equal to the predetermined reference value lasts for the predetermined time period, history information of the fault indication information (indicating whether a faulty FOUP is indicated or not), an indication clear signal (indication clear information) indicating that indication of the faulty FOUP is cleared, etc., are stored in the data storage region 32.

A touch panel is installed in the display unit 31 of the controller 240 for use in a substrate processing apparatus. The touch panel is configured to display a manipulation screen for receiving an input of a manipulation command into the substrate transfer system or the substrate process system described above. The manipulation screen includes various input indicators and manipulation buttons for checking the state of the substrate transfer system or the state of the substrate process system or inputting an operating instruction to the substrate transfer system or the substrate process system. Also, the manipulation unit preferably includes at least the display unit 31 and the input unit 29, similar to a manipulation terminal (terminal device) such as a personal computer (PC) or a mobile device.

The transfer controller 11 is configured to control transfer operations of the rotary pod shelf 105, the boat elevator 115, the pod transfer device (substrate storage container transfer device) 118, the wafer transferring mechanism (substrate transferring mechanism) 125, the boat 217, and the rotation mechanism 254 that constitute the substrate transfer system. Although not shown, sensors are included in the rotary pod shelf 105, the boat elevator 115, the pod transfer device (substrate storage container transfer device) 118, the wafer transferring mechanism (substrate transferring mechanism) 125, the boat 217, and the rotation mechanism 254 that constitute the substrate transfer system. When these sensors each indicate a predetermined value or an abnormal value, the transfer controller 11 is configured to inform the controller 240 for use in a substrate processing apparatus of this status.

The temperature controller 12 is configured to control temperature in the process furnace 202 by controlling the temperature of the heater 206 of the process furnace 202 and to inform the controller 240 for use in a substrate processing apparatus of this status when the temperature sensor 263 indicates the predetermined value or the abnormal value.

The pressure controller 13 is configured to control the pressure adjustment device 242 based on a pressure detected by the pressure sensor 245 so that the pressure in the process chamber 201 may become equal to a desired pressure at a desired timing, and to inform the controller 240 for use in a substrate processing apparatus of this status when the pressure sensor 245 indicates the predetermined value or the abnormal value.

The gas supply controller 14 is configured to control supplying of gases or stopping of the supply of the gases using the process gas supply pipe 232a and the purge gas supply pipe 232b by opening or closing a gas valve (not shown). Also, the gas supply controller 14 is configured to control the MFCs 241a and 241b to control a gas supplied into the process chamber 201 to have a desired flow rate at a desired timing. When a gas valve (not shown) or sensors (not shown) included in the MFCs 241a and 241b indicate a predetermined value or an abnormal value, the gas supply controller 14 is configured to inform the controller 240 for use in a substrate processing apparatus of this status.

Also, the gas supply controller 14 serving as a monitoring unit controls the purge mechanism serving as a gas supply unit (which will be described below) to supply an inert gas at a predetermined flow rate or more to the loading port 114 and the rotary pod shelf 105 on which the pods 110 are disposed. Also, a detection unit (e.g., a mass flow meter (MFM), an MFC, a flow rate system, etc.,) included in the purge mechanism detects the flow rate of the inert gas. Also, when the predetermined value detected by the detection unit is an abnormal value, the gas supply controller 14 is configured to inform the controller 240 for use in a substrate processing apparatus serving as a management unit of this status. The purge mechanism may be installed in each of the loading port 114 and the rotary pod shelf 105 but is not limited thereto and may be installed in any device provided the device has a structure of supplying an inert gas ($N_2$ gas in the present disclosure).

The gas supply controller 14 serving as a monitoring unit includes at least a comparison unit that compares the flow rate of the inert gas with a preset reference value, a determination unit that determines it 'abnormal' when the flow rate of the inert gas is less than the preset reference value, and a reporting unit that reports various alarms including an alarm indicating a flow rate is in an abnormal state to the management unit. These elements of the gas supply controller 14 are operated according to the flow-rate monitoring program 35 including the first flow-rate monitoring program and the second flow-rate monitoring program. Also, the gas supply controller 14 serving as a monitoring unit may execute the gas supply program 34 for supplying an inert gas (e.g., $N_2$ gas) into an appropriate amount of pods 110, except for during the movement of the pod 110.

The gas supply unit ($N_2$ purge mechanism) is installed in each of the loading port 114 and the rotary pod shelf 105. For example, the gas supply unit ($N_2$ purge mechanism) is installed in both the loading port 114 and the rotary pod shelf 105. Also, the gas supply unit includes at least a detection unit. An MFC may be connected as a detection unit to all of the gas supply units. For example, an MFC may be connected as a detection unit to the gas supply unit installed on the loading port 114, and an MFM may be connected as a detection unit to the gas supply unit installed on the rotary pod shelf 105. Also, one of a flow meter which measures the flow rate of a gas or an MFM which measures the flow rate of a predetermined amount of a gas, a concentration meter that measures the concentration of oxygen, a hygrometer that measures humidity, a dew point hygrometer, and an MFC that controls the flow rate of a gas, or a combination thereof may be connected as a detection unit to the gas supply units installed on the respective loading port 114 and the rotary pod shelf 105.

(Mechanism for Performing Purging by Supplying Inert Gas)

Figure 14:
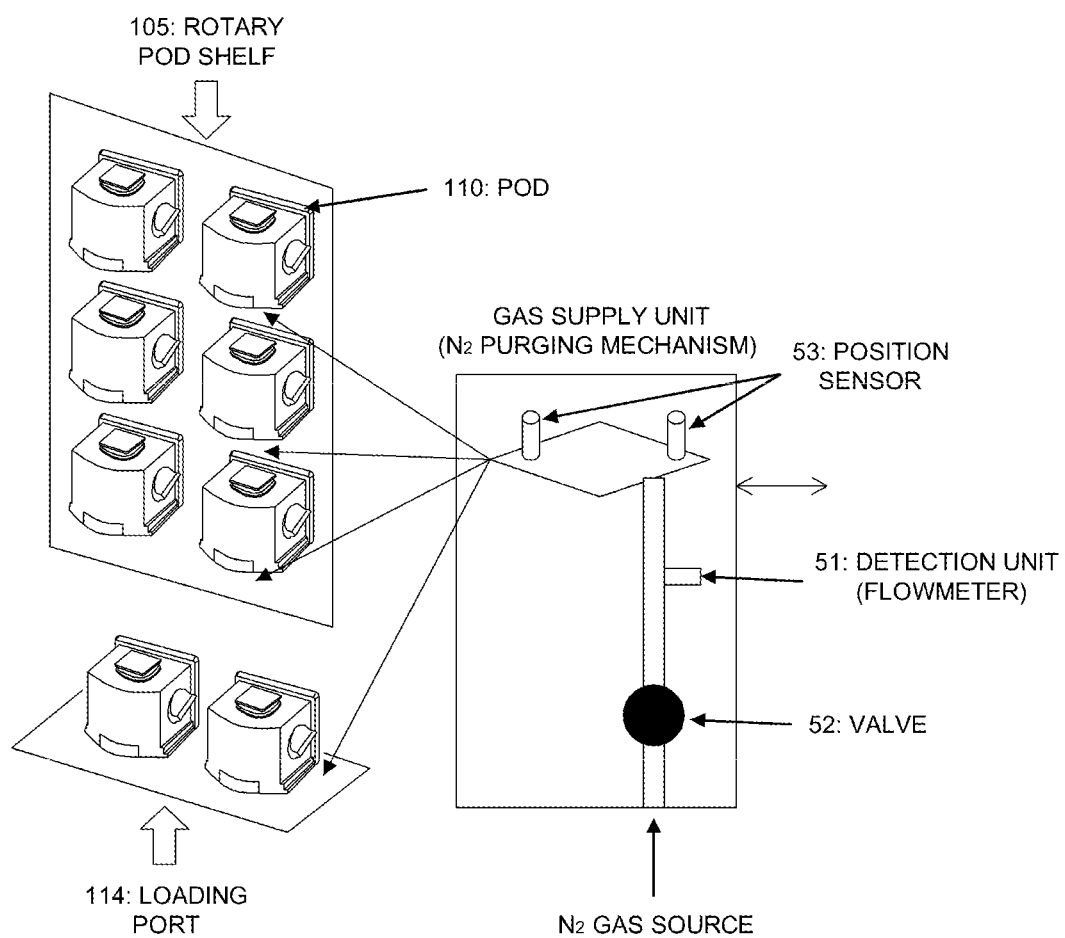
FIG. 14 is a diagram illustrating a gas supply unit for supplying an inert gas into a substrate storage container placed on a receiving shelf and a support unit included in a substrate processing apparatus according to an embodiment of the present invention.

First, the purge mechanism serving as gas supply unit will be described with reference to FIG. 14. As illustrated in FIG. 14, the purge mechanism is installed in the loading port 114 serving as substrate storage container on which the pod 10 is disposed and the rotary pod shelf 105 so as to perform purging using an inert gas. The purge mechanism includes at least a detection unit 51 and a valve 52. When each of the pods 110 is placed on one of the loading ports 114 and the rotary pod shelves 105, a position sensor 53, which is a protrusion, may be pressurized by the pod 110. When a signal is received from the position sensor 53, the gas supply controller 14 opens the valve 52 to supply an inert gas from an $N_2$ gas source (not shown) and exhaust the inert gas via a gas exhaust unit (not shown). Alternatively, the purge mechanism need not be individually installed each of the loading ports 114 and the rotary pod shelves 105, and may be configured to supply a predetermined amount of an inert gas ($N_2$ gas in the present embodiment) to each of the loading ports 114 and the rotary pod shelves 105. Also, the detection unit 51 is preferably one of a flow meter that measures the flow rate of a gas, a concentration meter that measures the concentration of oxygen, a hygrometer that measures humidity, a dew point hygrometer, an MFC that controls the flow rate of a gas, and an MFM that measures the flow rate of a gas.

Alternatively, the detection unit 51 need not be capable of measuring the flow rate of a gas. For example, the detection unit 51 may be a flow-rate switch configured to output a signal when the flow rate of a gas reaches a predetermined reference value. However, in this case, the predetermined reference value should be appropriately set. In many cases, the predetermined reference value may be determined according to the specifications of a flow-rate detection unit to be used.

(Setting of $N_2$ Purging Schedule)

Figure 6:
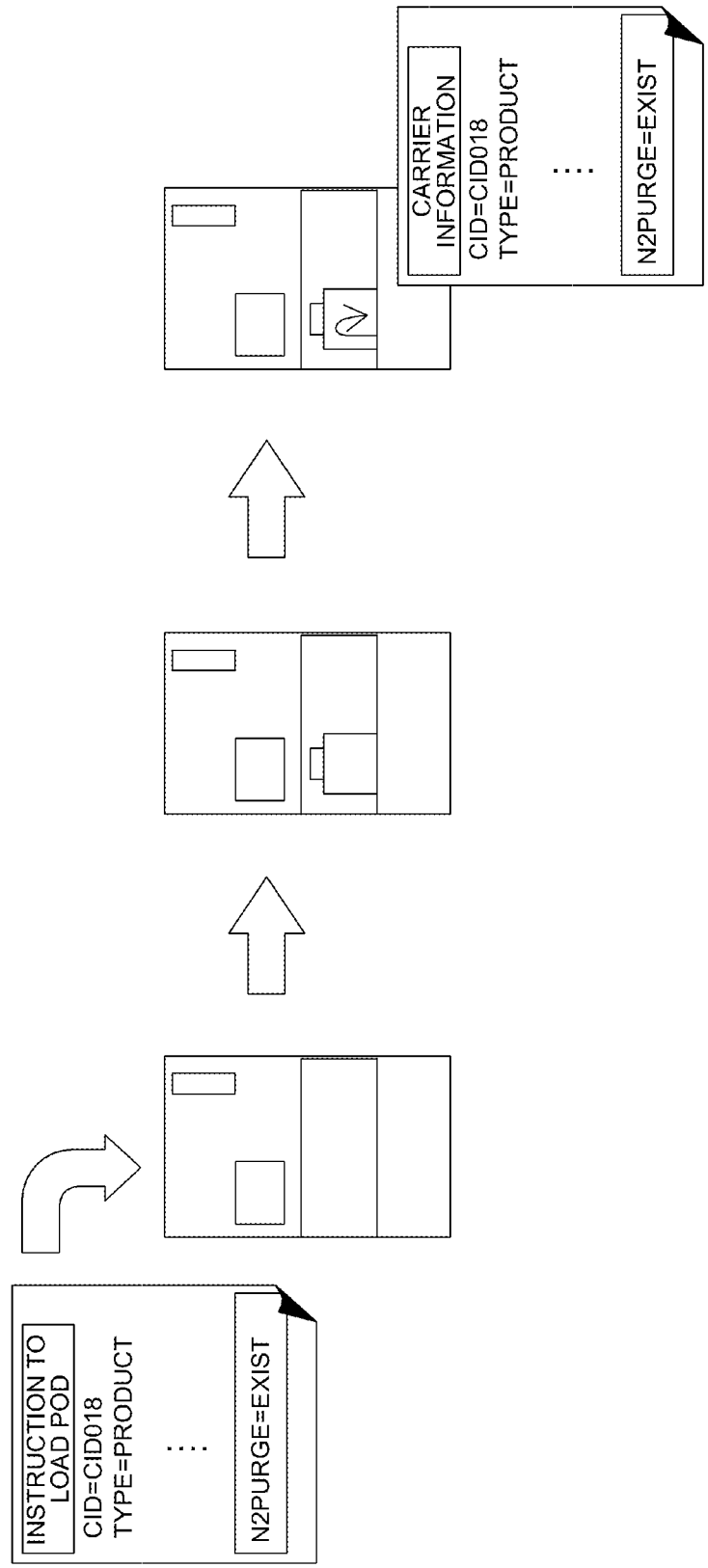
FIG. 6 is a diagram illustrating a purge setting process when a substrate storage container is loaded into a substrate processing apparatus according to an embodiment of the present invention.

Next, setting an $N_2$ purging schedule when a substrate storage container is loaded will be described with reference to FIG. 6 below.

There are cases in which an inert gas need not be supplied according to the shape of the pod 110 as a FOUP or the type of the wafer 200. Thus, whether the inert gas is to be supplied into the pod 110 is determined, based on a determination as to whether $N_2$ purging (supply of the inert gas) is scheduled to be performed when an instruction to load the pod 110 into the substrate processing apparatus 100 is given. For example, instruction data instructing to load the pod 110, which is given from a high-rank computer such as a host computer, includes at least carrier ID (CID) as information for identifying the pod 110, information regarding the type of the wafers 200 accommodated in the pod 110 which is information regarding the type of substrates, and information indicating whether purging ($N_2$ purging) is scheduled. However, embodiments of the present invention are not limited thereto, and for example, a substrate process recipe may be set as a process recipe and a maintenance recipe may be set as a cleaning recipe. Also, the instruction data instructing to load the pod 110 may include information such as flow-rate reference value information, a supply monitoring time, and an abnormality recovery time which will be described below.

When the pod 110 arrives at the loading port 114, the controller 240 for use in a substrate processing apparatus receives the instruction data instructing to load the pod 110 and checks whether purging is scheduled to supply an inert gas into the pod 110. The controller 240 may be also configured to display the instruction data on a manipulation screen installed in the display unit 31. Also, the controller 240 may be configured to edit the instruction data displayed on the manipulation screen. For example, the controller 240 is preferably configured to set whether purging is to be scheduled for the pod 110. When an empty pod 110 arrives at the loading port 114, the controller 240 may change settings to cancel a purge schedule on the manipulation screen when the purge schedule is included in the instruction data. Thus, the inert gas may be suppressed from being erroneously supplied into the empty pod 110. Similarly, when a purge schedule is included in the instruction data for a pod 10 accommodating a dummy substrate, the controller 240 may change settings to cancel the purge schedule. In other words, when a purge schedule is not included in the instruction data for a pod 110 accommodating a product substrate, the controller 240 may change settings to execute the purge.

Purging, using an inert gas, is performed in the loading port 114 by the gas supply controller 14. Also, when the pod 110, which is scheduled to be purged and instructed to be loaded according to the instruction data, arrives at the loading port 114, the controller 24Q for use in a substrate processing apparatus, may determine that the pod 110 is identical with the pod 110 placed on the loading port 114, and control the gas supply controller 14 to start $N_2$ purging in the pod 110 to supply a predetermined amount of $N_2$ gas into the pod 110 placed on the loading port 114 serving as a support unit.

Here, information indicating whether a purge schedule is arranged is managed as carrier information for each of the pods 110, and then $N_2$ purging is performed based on this information. When the controller 240 instructs the transfer controller 11 to start pod loading, the pod 110 placed on the loading port 114 and to which a gas is supplied starts to be moved to the pod opener 121 to the rotary pod shelf 105 by the pod transfer device 118. Also, carrier information including ID information of the pod 110, information regarding the type of the wafer 200, and information indicating whether purging is scheduled is stored in the memory unit 28.

(Gas Supply During PICK-UP OPERATION)

Figure 7:
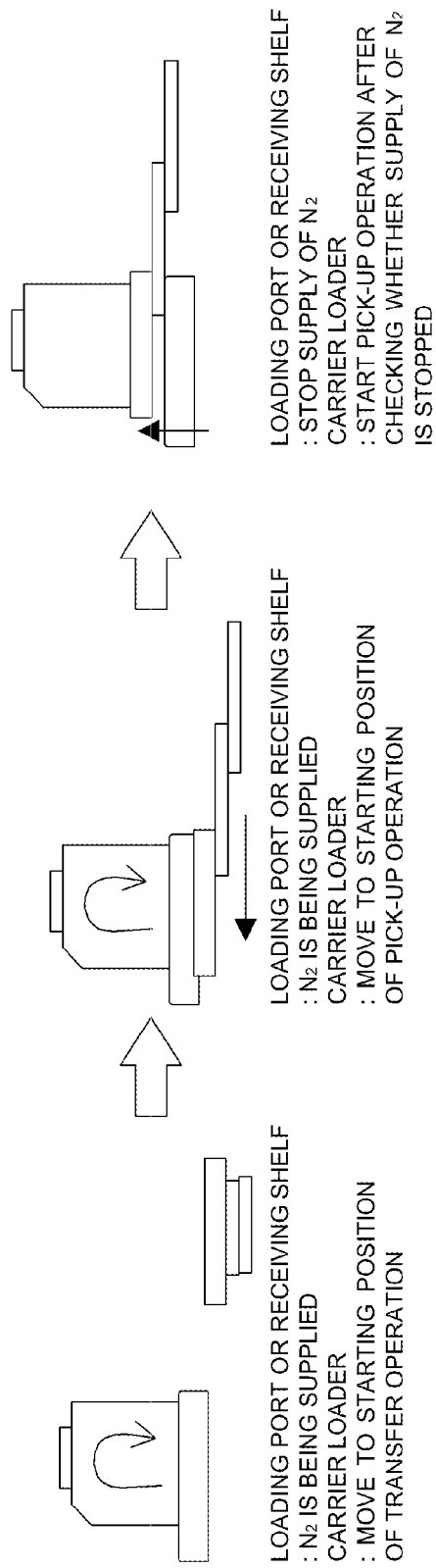
FIG. 7 is a diagram illustrating a timing of stopping supply of an inert gas during an operation (PICK-UP OPERATION) of a substrate storage container according to an embodiment of the present invention.

FIG. 7 is a diagram illustrating a timing of stopping supply of an inert gas during an operation (PICK-UP OPERATION) of a substrate storage container according to an embodiment of the present invention.

As illustrated in FIG. 7, movement of the pod 110 serving as a substrate storage container is performed by the pod transfer device 118 as a carrier loader (hereinafter referred to as the carrier loader 118), according to an instruction from the transfer controller 11. Here, the gas supply controller 14 stops the supply of a gas in association with an operation of picking the pod 110 from the loading port 114 (PICK-UP OPERATION) performed by the carrier loader 118.

A gas is supplied into the pod 110 by the gas supply controller 14 in a state where the pod 110 is placed on the loading port 114 or the rotary pod shelf 105 serving as a receiving shelf. In this case, the carrier loader 118 receives an instruction from the transfer controller 11 to move to a starting position of a transfer operation.

Until the movement of the carrier loader 118 to a starting position of the pick-up operation ends, the pod 110 is kept in place on the loading port 114 or the rotary pod shelf 105 and the supply of the gas is performed by the gas supply controller 14.

Then, the supply of the gas by the gas supply controller 14 is stopped, the controller 240 for use in a substrate processing apparatus determines whether the supply of $N_2$ is stopped and instructs the transfer controller 11 to start the operation (start PICK-UP OPERATION), and the carrier loader 118 picks up the pod 110 according to an instruction to start the PICK-UP OPERATION which is given from the transfer controller 11.

(Supply of $N_2$ During Placing Operation)

Figure 8:
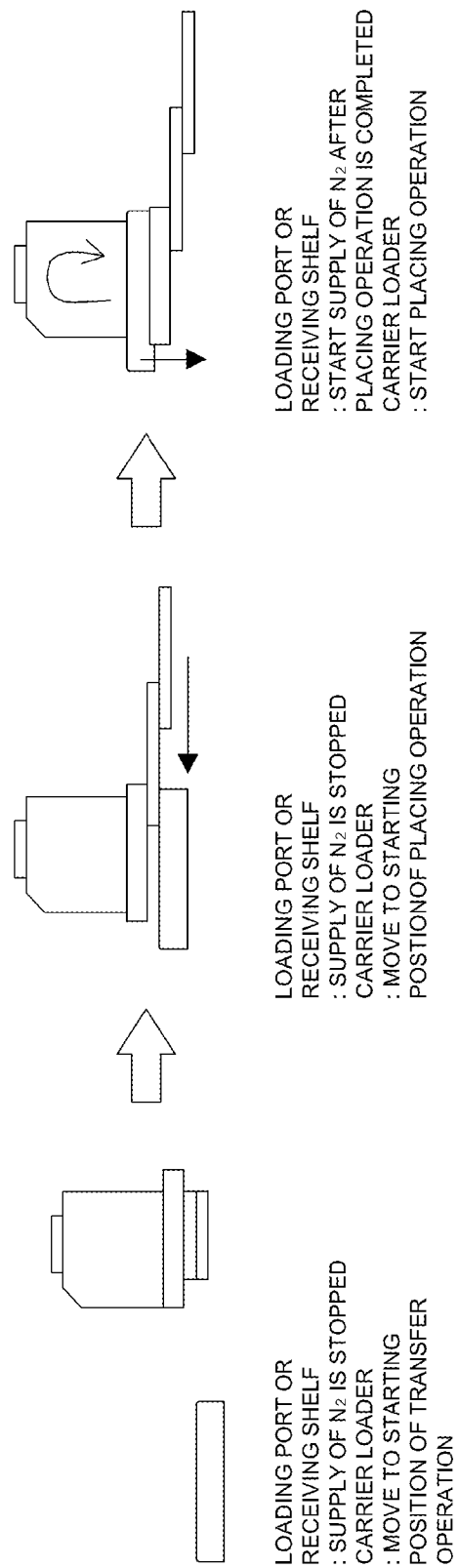
FIG. 8 is a diagram illustrating a timing of supplying an inert gas during an operation (placing operation) of a substrate storage container according to an embodiment of the present invention.

FIG. 8 is a diagram illustrating a timing of supplying an inert gas during an operation (placing operation) of a substrate storage container according to an embodiment of the present invention.

As illustrated in FIG. 8, when the pod 110 is unloaded from the loading port 114 or the rotary pod shelf 105, the gas supply controller 14 starts to supply an inert gas in association with an operation of placing the pod 110 on the loading port 114 (placing operation) performed by the carrier loader 118.

As illustrated in FIG. 8, when the pod 110 is transferred by the carrier loader 118, supply of a gas into the loading port 114 or the rotary pod shelf 105 is stopped.

When the placing operation is started and the operation of placing the pod 110 on the loading port 114 to the rotary pod shelf 105 is completed by the carrier loader 118, the gas supply controller 14 starts the supply of a gas.

As described above, all of the movements of the pod 110 to the loading port 114 serving as a support unit, to the rotary pod shelf 105 serving as a receiving unit, and to the pod opener 121 serving as a transfer unit are performed using the carrier loader 118. Thus, the supply of the gas is started in association with the operation of placing the pod 110 on each of support units and receiving shelves, and supply of the $N_2$ is stopped in association with the PICK-UP OPERATION.

Through the above-described control, purging using inert gas (e.g., $N_2$ gas) may be performed at ordinary times between when the pod 110 is loaded into the substrate processing apparatus 100 and when the pod 110 is unloaded from the substrate processing apparatus 100, except for during the movement of the pod 110.

(Supply of $N_2$ During Unloading Operation on Loading Port)

Figure 9:
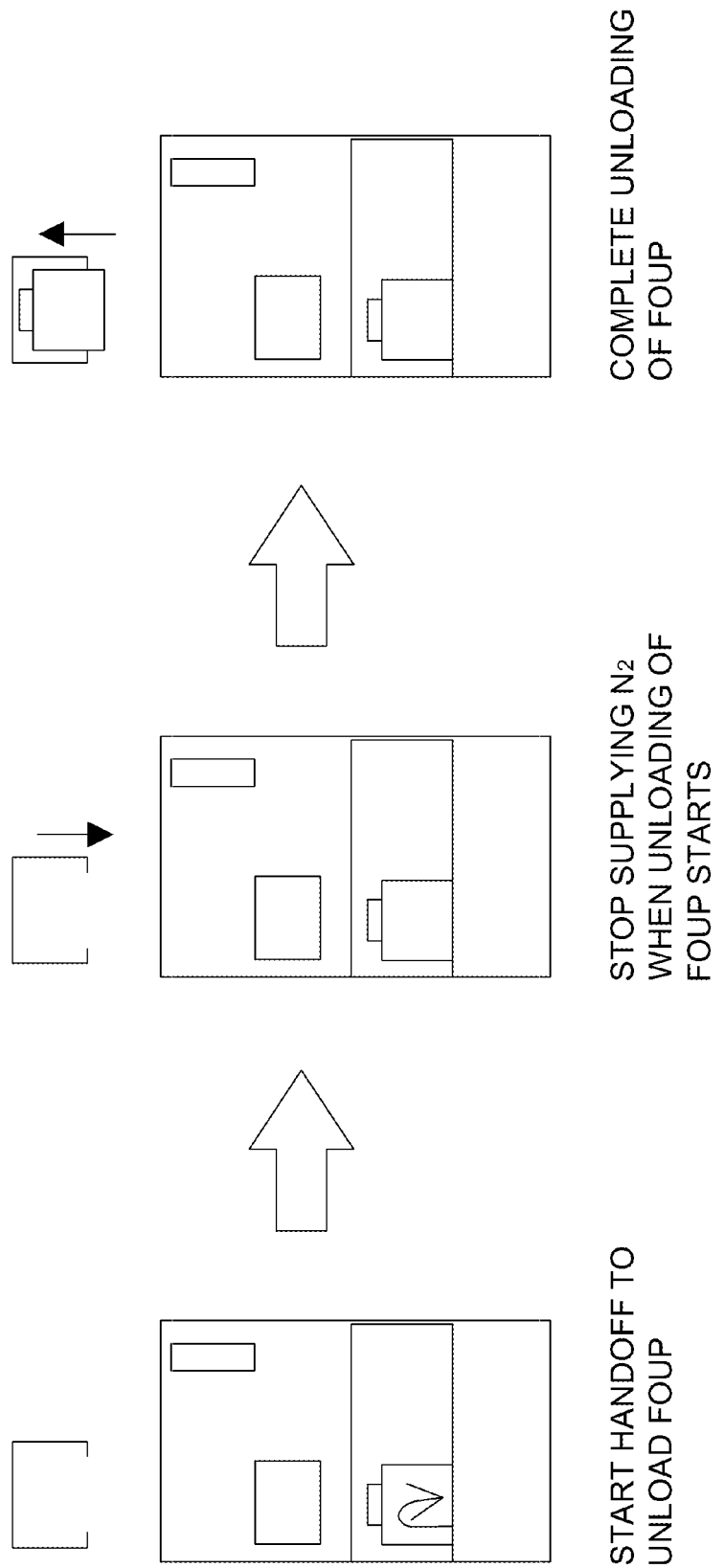
FIG. 9 is a diagram illustrating a timing of stopping supply of an inert gas during an operation of unloading a substrate storage container from a loading port of a substrate processing apparatus according to an embodiment of the present invention.

FIG. 9 is a diagram illustrating a timing of stopping supply of an inert gas during an operation of unloading a substrate storage container (e.g., the pod 110) from the loading port 114 of a substrate processing apparatus according to an embodiment of the present invention.

When unloading of the pod 110 from the loading port 114 starts, the supply of the gas by the gas supply controller 14 is stopped.

(Detection of 'Abnormal' State and Indication of Faulty FOUP Performed by Monitoring Flow Rate of $N_2$ Gas)

Figure 10:
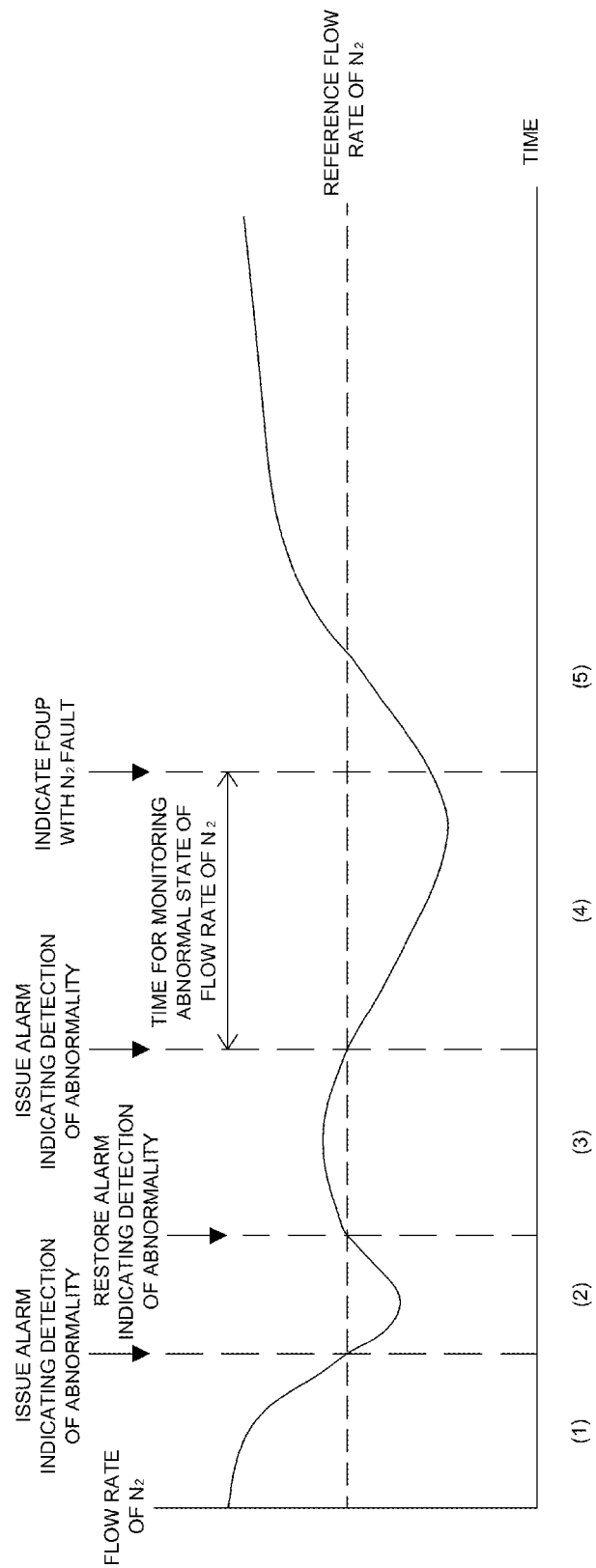
FIG. 10 is a graph showing a process of monitoring the amount of $N_2$ gas supplied into a substrate storage container according to an embodiment of the present invention.

FIG. 10 is a graph showing a process of monitoring an amount of a gas supplied into a substrate storage container according to an embodiment of the present invention. Also, FIG. 10 is a graph showing the relation between a flow rate of the supplied gas and a monitoring time when the flow-rate monitoring program (the first flow-rate monitoring program) is run according to an embodiment of the present invention. The graph (raw data) is configured to be displayed on the display unit 31.

The controller 240 for use in a substrate processing apparatus executes the flow-rate monitoring program, and starts to monitor an abnormal state when the supply of the gas is stopped due to a fault occurring during supply of a gas into the pod 110. Here, the abnormal state is detected by monitoring the flow rate of the gas supplied into the pod 110. The gas supply controller 14 determines it 'abnormal' when the flow rate of the gas is less than a reference value, and issues an alarm indicating the abnormal flow rate to the controller 240 for use in a substrate processing apparatus. The details of the 'abnormal' state and the contents of the alarm may be displayed on the display unit 31.

When the abnormal flow rate of the gas lasts for more than a monitoring time indicated with a specific parameter, the pod 110 is handled as a faulty FOUP (indication of faulty FOUP). Specifically, the controller 240 for use in a substrate processing apparatus indicates the pod 110 as a faulty FOUP. A period in which the pod 110 is moved is not considered as a gas supply stop time.

(First Flow-Rate Monitoring Program)

When the controller 240 for use in a substrate processing apparatus executes the flow-rate monitoring program, the flow rate of a gas in the pod 110 is compared with a preset reference value (reference value of the flow rate of $N_2$). FIG. 10(1) or (3) denotes a normal state. FIG. 10(2) denotes a state where a detected flow rate is less than the reference value, an alarm indicating 'abnormal' is output, the detected flow rate that is less than the reference value is changed to reach the reference value within a monitoring time (supply monitoring time) that is preset according to another parameter and the alarm is thus canceled. FIG. 10(4) denotes a state where a flow rate is less than the reference value, an alarm indicating 'abnormal' is generated, that the flow rate that is less than the reference value lasts for a preset monitoring time period (supply monitoring time), and thus, a target pod 110 is indicated as a faulty FOUP. FIG. 10(5) denotes a state where the faulty FOUP is determined to be not restorable and prohibited from being used.

TABLE 1

| | Abnormal state | State of FOUP | History of faulty FOUP |
|---|---|---|---|
| 1 | Not detected | Normal | None |
| 2 | Under detection | Normal | None |
| 3 | Not detected | Normal | None |
| 4 | Under detection | Normal | None |
| 5 | Under detection | Abnormal | Exist |

Table 1 shows data stored in the memory unit 28 when the first flow-rate monitoring program is executed as illustrated in FIG. 10, according to an embodiment of the present invention. In Table 1, the vertical items each denote a first monitoring time period (supply monitoring time) and the horizontal items denote the types of the stored data. The stored data includes at least data indicating an abnormal detection state, data indicating the state of the FOUP, and data indicating the indication history of a faulty FOUP. Here, the data indicating the abnormal detection state representing a result of detecting an abnormal flow rate includes two types of state data, i.e., 'not detected (normal)' and 'under detection (abnormal)'. Similarly, the data indicating the state of the FOUP includes two types of state data, i.e., 'normal' and 'abnormal'. The data indicating the indication history of a faulty FOUP includes two types of state data, i.e., 'exist' and 'none'.

The stored data is, however, not limited to the three types of data described above. The first monitoring time period is, for example, fifteen seconds. Also, the first monitoring time period may be set to be reconfigurable.

(Second Flow-Rate Monitoring Program)

The second flow-rate monitoring program is an improvement of the first flow-rate monitoring program. In the first flow-rate monitoring program, when a faulty FOUP is indicated, the use of the pod 110 is prohibited and then this program ends. Thus, unprocessed substrates present in the pod 110 are neglected and discarded. Thus, in the second flow-rate monitoring program, a process of restoring a faulty FOUP to a normal state by clearing predetermined conditions after the faulty FOUP is indicated is added based on a point of view that it is desirable to maintain substrate processing as long as possible.

The second flow-rate monitoring program will be described with reference to FIG. 11. First, states (1) to (5) are the same as those according to the first flow-rate monitoring program and thus are not described again here.

Figure 11:
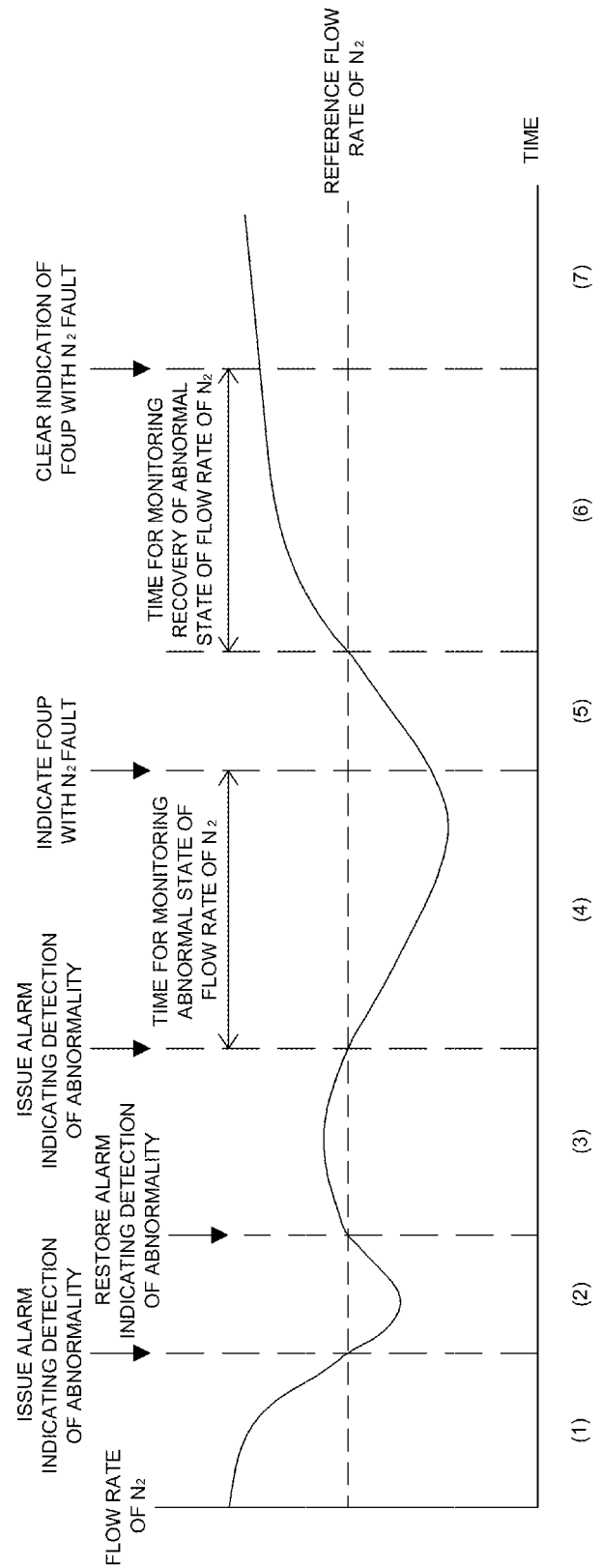
FIG. 11 is a graph showing a process of monitoring the amount of $N_2$ gas supplied into a substrate storage container according to another embodiment of the present invention.

FIG. 11(6) denotes a state where, even after a faulty FOUP is indicated, the supply rate of a gas is monitored by the gas supply controller 14 and managed by the controller 240 for use in a substrate processing apparatus, a flow rate that exceeds a reference value lasts for a preset second monitoring time period (abnormality recovery time), and thus, the indication of the faulty FOUP is cleared. FIG. 11(7) denotes a normal state similar to the state (1) except that the indication history of the faulty FOP occurring during execution of the program is retained.

TABLE 2

| | Abnormal state | $N_2$ fault FOUP | History of fault FOUP |
|---|---|---|---|
| 1 | Not detected | Normal | None |
| 2 | Under detection | Normal | None |
| 3 | Not detected | Normal | None |
| 4 | Under detection | Normal | None |
| 5 | Under detection | Abnormal | Exist |
| 6 | Under detection | Abnormal | Exist |
| 7 | Not detected | Normal | Exist |

Table 2 shows data stored in the memory unit 28 when the second flow-rate monitoring program is executed as illustrated in FIG. 11, according to an embodiment of the present invention. In Table 2, the vertical and horizontal items are the same as those in Table 1. Also, the data stored in the memory unit 28 is the same as that in Table 1. The second monitoring time period (abnormality recovery time period) is, for example, sixty seconds.

As described above, according to the present embodiment, the pod 110 indicated as a faulty FOUP may be handled by selectively using control methods below using the two flow-rate monitoring programs.

(1) When a FOUP is prohibited from being used, a pod 110 that exceeds a predetermined time period is considered as being not restorable and prohibited from being used.

(2) When the pod 110 is restored through a continuous gas supply, although the pod 110 is prohibited from being used through detection of abnormality, the pod 110 may be used again when the flow rate of a supplied gas exceeds a reference value and such a gas supply state lasts for a predetermined time period (abnormality recovery time). Although the pod 110 is restored, the history that the pod 110 was prohibited from being used may be determined for each of the FOUPs.

Here, the above-described embodiment is just one embodiment of the present invention. One of or both of the two control methods may be selectively used. Also, the first flow-rate monitoring program and the second flow-rate monitoring program may be individually executed with respect to a placing shelf and a receiving shelf.

(Unloading of Faulty FOUP)

When a pod 110 is unloaded at an abnormal gas flow rate from a location on the rotary pod shelf 105 or loading port 114 serving as a receiving shelf, another pod 110 is prohibited from being loaded to the location on the rotary pod shelf 105 or the loading port 114. This is to prevent another pod 110 from being loaded in a state where the supply rate of a gas may be at an abnormal level.

Figure 12:
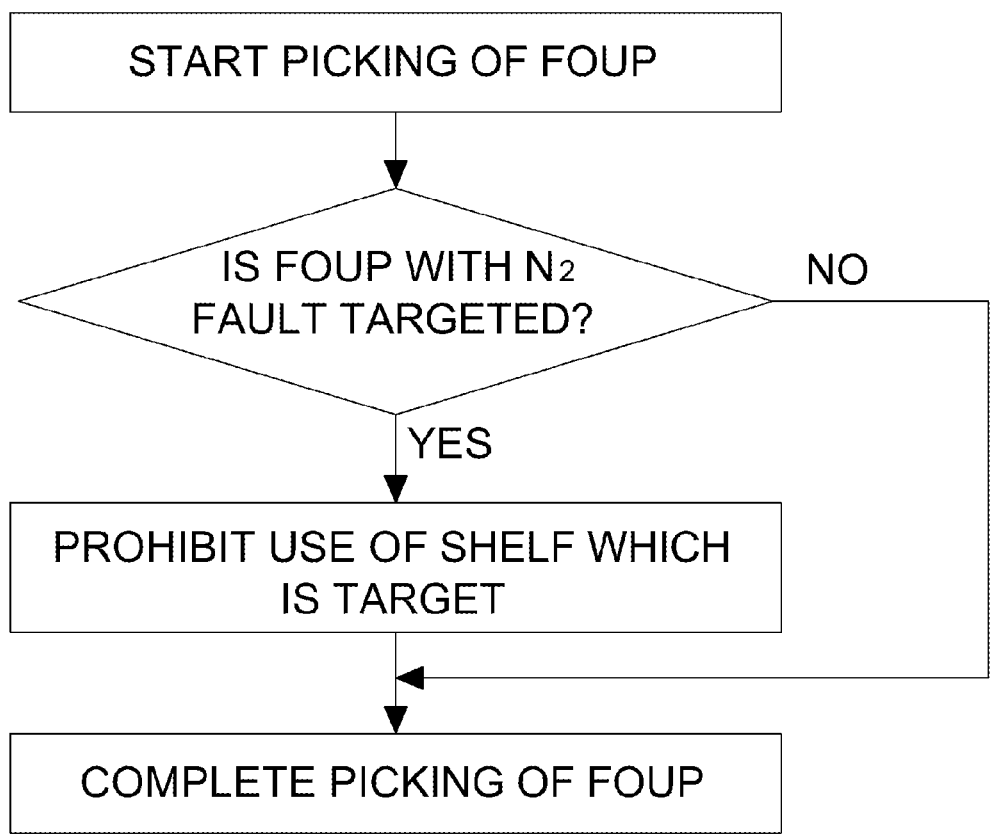
FIG. 12 is a flowchart of a process of prohibiting use of a receiving shelf (or a support unit) included in a substrate processing apparatus according to an embodiment of the present invention.

FIG. 12 is a flowchart of a process of prohibiting use of the rotary pod shelf 105 as a receiving shelf according to an embodiment of the present invention. In the process of FIG. 12, it is determined whether the pod (FOUP) 110 is indicated as a faulty FOUP when the operation of picking up the pod (FOUP) 110 starts, and the pod (FOUP) 110 is prohibited from being used and the operation of picking up the pod (FOUP) 110 is discontinued when the pod (FOUP) 110 is indicated as a faulty FOUP.

(Unloading of FOUP)

Figure 13:
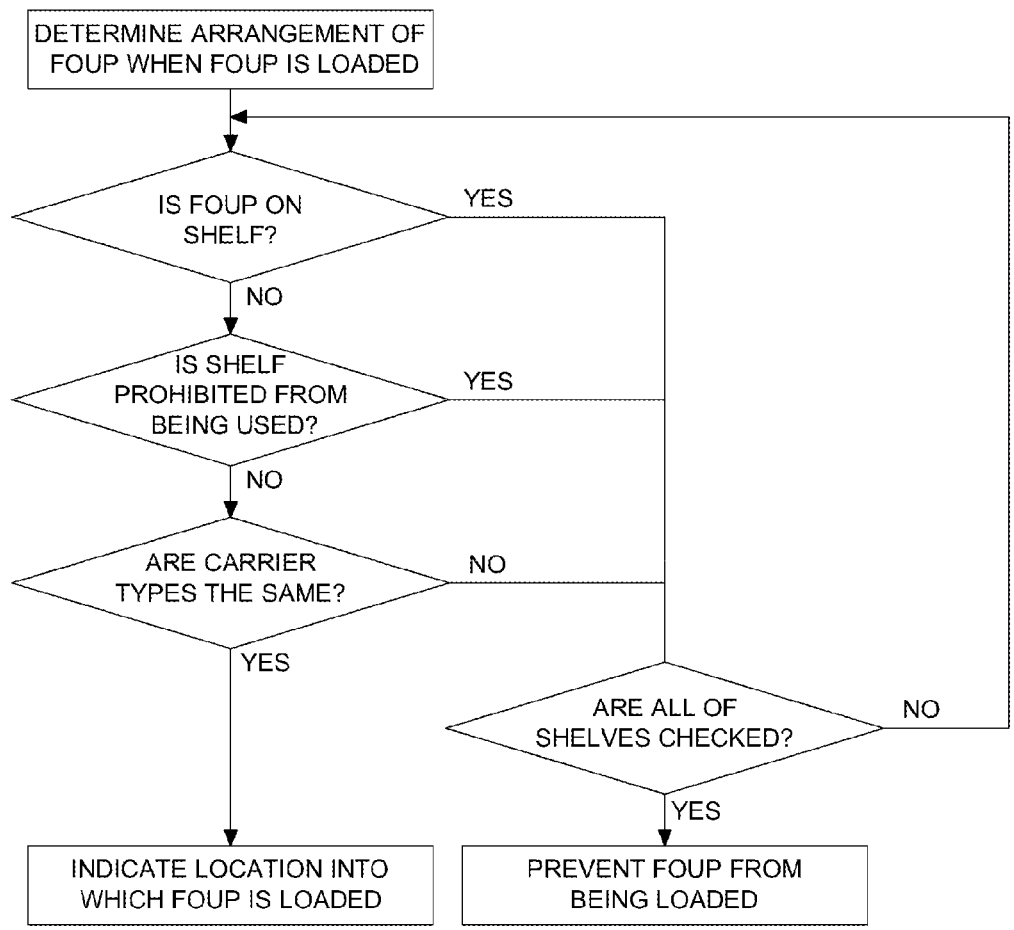
FIG. 13 is a flowchart of a process of prohibiting a pod from being loaded into a receiving shelf and a support unit included in a substrate processing apparatus according to an embodiment of the present invention.

FIG. 13 is a flowchart of an arrangement determination process of determining a shelf on which the pod (FOUP) 110 is to be arranged when the pod (FOUP) 110 is loaded. Whether the pod (FOUP) 110 is present on the shelf, whether the types of carriers are the same, and whether the shelf is prohibited from being used when the pod (FOUP) 110 is not present on the shelf are determined. Accordingly, it is possible to avoid unnecessary errors Effects of an Embodiment of the Present Invention As described above, according to the present embodiment, it can reduce an effect on a wafer caused by a change in an atmosphere in the pod 110 by purging the pod 110 with an inert gas. Also, it can prevent production from proceeding in an abnormal state by monitoring the flow rate of a gas. In the present embodiment, a method of monitoring a gas in the pod 110 which is capable of preventing the concentration of $O_2$ in the pod 110 from increasing when supply of $N_2$ is stopped due to a failure or the like or when an insufficient amount of $N_2$ is supplied is provided. Also, an abnormal state of $N_2$ supplied into the pod 110, e.g., an increase in the concentration of $N_2$, may be detected, and the pod 110 may be prohibited from being used when the abnormal state lasts for a predetermined time period or longer. Accordingly, a pod 110 in which an abnormal state of $N_2$ occurs may be identified and used as a reference for determining a process result.

Also, when a flow meter is used, purging using an inert gas may be performed at a lower cost than when an MFC is installed on each of shelves. Also, according to the present embodiment, for example, even if a valve for supplying a gas is open, when a gas is not supplied or the supply rate of the gas is insufficient, this matter may be immediately detected by monitoring the flow rate of gas. Also, degradation in the quality of a substrate may be suppressed by preventing use of a pod 110 in which the flow rate of a gas is abnormal.

Other Embodiments of the Present Invention

Although the present embodiment has been described above in detail with respect to the flow rate of a supplied gas, the present invention is not limited thereto and is also applicable in relation to, for example, the concentration of $O_2$. Thus, the present invention may provide a method of monitoring the flow rate of a gas in the pod 110, which is capable of preventing the concentration of $O_2$ in the pod 110 from increasing when supply of an inert gas is stopped due to a failure or when an insufficient amount of a gas is supplied. Also, an abnormal supply state of a gas into the pod 110, e.g., an increase in the concentration of $O_2$ in the pod 110, may be detected and use of the pod 110 may be prohibited when the abnormal supply state lasts for a predetermined time period or longer.

Also, although in the present embodiment a case in which nitrogen gas ($N_2$ gas) is used as an inert gas has been described in detail, helium gas (He gas), neon gas (Ne gas), argon gas (Ar gas), or the like may be used as the inert gas.

Also, although in the present embodiment, a semiconductor manufacturing device is used as an example of a substrate processing apparatus, the substrate processing apparatus is not limited thereto and may be an apparatus capable of processing a glass substrate such as a liquid crystal display (LCD) device. Also, the details of substrate processing are not limited thereto, and substrate processing may not only be film-forming processing but also annealing, oxidation, nitridation, a diffusion treatment, etc. Also, the film-forming processing may be processing for forming, for example, an oxide film, a nitride film, or a film containing a metal.

Although various embodiments of the present invention have been described above in detail, the present invention is not limited thereto and may be embodied in many different forms without departing from the spirit and scope of the invention.

A substrate processing apparatus according to the present invention is capable of suppressing an effect on a substrate due to a change in an atmosphere in a substrate storage container by monitoring the flow rate of an inert gas supplied into the substrate storage container between when the substrate storage container is loaded into a device and after the substrate storage container is unloaded from the device.

Exemplary Embodiments of the Present Invention

The following supplementary notes are added herein as exemplary embodiments of the present invention.

(Supplementary Note 1)

According to one aspect of the present invention, there is provided a substrate processing apparatus including a gas supply unit installed in at least one of a support unit and a receiving unit for accommodating a substrate storage container, and configured to supply a predetermined gas into the substrate storage container; a monitoring unit configured to compare a flow rate of a predetermined gas supplied into the substrate storage container via the gas supply unit with a preset reference value and output a signal indicating a result of comparison between the flow rate of a predetermined gas and the preset reference value; and a management unit configured to manage a transfer state of the substrate storage container based on the signal outputted from the monitoring unit.

(Supplementary Note 2)

In the substrate processing apparatus of Supplementary note 1, preferably, the monitoring unit outputs to the management unit a fault indication signal indicating the substrate storage container having the predetermined gas supplied thereto is in a faulty state when a state where the flow rate of a predetermined gas is less than the preset reference value lasts longer than a preset monitoring time period (first monitoring time period), and the management unit inhibits the substrate storage container in the faulty state from being loaded into and unloaded from at least one of the support unit and the receiving unit when the management unit receives the fault indication signal.

(Supplementary Note 3)

In the substrate processing apparatus of Supplementary note 2, preferably, the monitoring unit outputs to the management unit a fault indication clear signal for clearing the faulty state of the substrate storage container when a state where the flow rate of a predetermined gas supplied into the substrate storage container indicated as being in the faulty state is greater than the preset reference value lasts longer than a predetermined time period (second monitoring time period); and the management unit permits the substrate storage container with an indication of the faulty state cleared to be loaded in and unloaded from at least one of the support unit and the receiving unit when the management unit receives the fault indication clear signal.

(Supplementary Note 4)

In the substrate processing apparatus of Supplementary note 1, preferably, the monitoring unit outputs to the management unit an alarm signal indicating a flow rate of the predetermined gas is in an abnormal state when the flow rate of a predetermined gas is less than the preset reference value, and outputs to the management unit a recovery signal indicating a recovery from the abnormal state when the flow rate of a predetermined gas becomes greater than the preset reference value during the preset monitoring time period (the first monitoring time period).

(Supplementary Note 5)

In the substrate processing apparatus of Supplementary note 1, the monitoring unit preferably includes at least a comparison unit configured to compare the flow rate of the predetermined gas with the preset reference value; a determination unit configured to determine the flow rate is in an abnormal state when the flow rate is less than the preset reference value; and a reporting unit configured to issue to the management unit an alarm indicating abnormality including the abnormal state of the flow rate.

(Supplementary Note 6)

In the substrate processing apparatus of Supplementary note 1, the gas supply unit preferably includes at least a valve configured to supply at least the predetermined gas; and a detection unit configured to detect the flow rate of the predetermined gas.

(Supplementary Note 7)

In the substrate processing apparatus of Supplementary note 6, the detection unit preferably includes one of a flow meter and a mass flow meter (MFM) for measuring a flow rate of a gas; a concentration meter for measuring the concentration of oxygen; a hygrometer and a dew point hygrometer for measuring humidity; and a mass flow controller (MFC) for controlling the flow rate of the predetermined gas.

(Supplementary Note 8)

In the substrate processing apparatus of Supplementary note 6, the detection unit preferably includes a flow rate switch.

(Supplementary Note 9)

In the substrate processing apparatus of Supplementary note 1, the management unit preferably outputs to the monitoring unit an instruction to supply an inert gas into the substrate storage container accommodated in the support unit or the receiving unit according to the type of a substrate accommodated in the substrate storage container.

(Supplementary Note 10)

In the substrate processing apparatus of Supplementary note 1, the management unit is preferably configured to output to the monitoring unit an instruction to supply an inert gas into the substrate storage container when the type of a substrate accommodated in the substrate storage container is a product substrate, and not to supply the inert gas into the substrate storage container when the type of the substrate accommodated in the substrate storage container is a dummy substrate.

(Supplementary Note 11)

According to another aspect of the present invention, there is provided a non-transitory computer-readable recording medium storing a flow-rate monitoring program and a flow-rate monitoring program including a sequence of comparing the flow rate of a gas supplied into a substrate storage container accommodated in a support unit or a receiving unit with a preset reference value; and a sequence of outputting one of: a signal (alarm signal) indicating an abnormal state of the flow rate of the gas; a signal (alarm recovery signal) indicating recovery from the abnormal state; and a signal (fault indication signal, fault indication clear signal) indicating a transfer state of the substrate storage container, selected based on a signal (comparison result signal) indicating the result of comparison between the flow rate of the gas and the preset reference value.

(Supplementary Note 12)

The non-transitory computer-readable recording medium storing the flow-rate monitoring program of Supplementary note 11 and a flow-rate monitoring program, preferably further including a first flow-rate monitoring program including a sequence of detecting a flow rate of a supplied gas and comparing the flow rate of the gas with a preset reference value with the substrate storage container placed on the support unit or the receiving shelf; a sequence of outputting the alarm signal when a result of comparison between the flow rate of the gas and the preset reference value indicates the flow rate of the gas is less than the preset reference value; a sequence of monitoring whether a state where the flow rate of the gas is less than the preset reference value lasts for a predetermined monitoring time; a sequence of indicating the substrate storage container as being in a faulty state (as a faulty FOUP) when the state lasts for the predetermined monitoring time or more; and a sequence of preventing transfer of the substrate storage container indicated as being in the faulty state (as a faulty FOUP) and a substrate in the substrate storage container.

(Supplementary Note 13)

The non-transitory computer-readable recording medium storing the flow-rate monitoring program and the flow-rate monitoring program of Supplementary note 11, preferably further including a second flow-rate monitoring program including a sequence of detecting the flow rate of the supplied gas and comparing the flow rate with a preset reference value with the substrate storage container placed on the support unit or the receiving shelf; a sequence of outputting the alarm signal when a result of comparison between the flow rate and the preset reference value indicates that the flow rate is less than the preset reference value; a sequence of monitoring whether a state where the flow rate of the gas is less than the preset reference value lasts for a predetermined monitoring time; a sequence of indicating the substrate storage container as being in a faulty state (as a faulty FOUP) when the state where the flow rate of the gas is less than the preset reference value lasts for the predetermined monitoring time or more; and a sequence of clearing the faulty state of the substrate storage container (as a faulty FOUP) when a state where the flow rate of the gas in the substrate storage container indicated as being in the faulty state (as a faulty FOUP) is greater than the preset reference value lasts longer than a predetermined recovery time.

(Supplementary Note 14)

The first flow-rate monitoring program of Supplementary note 12 or the second flow-rate monitoring program of 13, preferably further including a sequence of outputting a signal for clearing the alarm when the flow rate of the gas reaches the preset reference value within the predetermined monitoring time.

(Supplementary Note 15)

According to another aspect of the present invention, there is provided a method of monitoring a flow rate of a gas, the method including a process of outputting a signal (alarm signal) indicating the flow rate is in an abnormal state when a result of comparison between the flow rate of a supplied gas and a preset reference value indicates that the flow rate is less than the preset reference value in a state where a substrate storage container is placed on at least one of a support unit and a receiving unit; a fault indication process of outputting a signal (fault indication signal) for indicating the substrate storage container as being in a faulty state when a state where the flow rate is less than the preset reference value lasts longer than a first monitoring time period; and a process of outputting an signal (alarm recovery signal) indicating recovery of the flow rate when the state where the flow rate is less than the preset reference value and where the flow rate of the gas becomes greater than the preset reference value lasts not longer than the first monitoring time period.

(Supplementary Note 16)

The method of Supplementary note 15, after the fault indication process, preferably further including a process of outputting a signal (indication clear signal) for clearing the faulty state of the substrate storage container when a state where the flow rate of the gas is greater than the preset reference value lasts longer than a predetermined second monitoring time period.

(Supplementary Note 17)

According to another aspect of the present invention, there is provided a transfer management method including a process of indicating the substrate storage container as being in a faulty state when a state where the flow rate of a supplied gas is less than a predetermined reference value lasts longer than a predetermined monitoring time with a substrate storage container placed on a support unit or a receiving shelf; and a process of preventing transfer of the substrate storage container indicated as being in the faulty state.

(Supplementary Note 18)

According to another aspect of the present invention, there is provided a method of transferring a substrate, the method including a substrate transfer process of transferring a substrate storage container accommodating a substrate between a support unit and a receiving unit; and a placing process of placing the substrate storage container on the support unit or the receiving unit, wherein the placing process includes a process of indicating the substrate storage container as being in a faulty state when a state where the flow rate of a gas supplied into the substrate storage container is less than a predetermined reference value lasts longer than a predetermined monitoring time; and a process of preventing transfer of the substrate storage container indicated as being in a faulty state (and a substrate present in the substrate processing apparatus).

(Supplementary Note 19)

According to another aspect of the present invention, there is provided a method of manufacturing a semiconductor device, the method including a substrate transfer process of transferring a substrate storage container accommodating a substrate between a support unit and a receiving unit; a substrate transfer process including a placing process of transferring the substrate storage container on the support unit or the receiving unit; a transfer process of transferring the substrate to a substrate retainer; and a processing process of inserting the substrate retainer retaining the substrate into a process furnace and processing the substrate, wherein the placing process includes a process of indicating the substrate storage container as being in a faulty state when a state where the flow rate of a gas supplied into the substrate storage container is less than a predetermined reference value lasts longer than a predetermined monitoring time; and a process of preventing transfer of the substrate storage container indicated as being in the faulty state (and the substrate present in the substrate processing apparatus).

(Supplementary Note 20)

According to another aspect of the present invention, there is provided a substrate processing apparatus including a gas supply unit configured to supply a predetermined gas onto a support unit and a receiving shelf on which a substrate storage container is placed; a substrate storage container transferring mechanism (first transferring mechanism) configured to transfer the substrate storage container between the support unit and the receiving shelf; a management unit configured to check whether a gas is supplied, based on information at least indicating whether to supply the gas into the substrate storage container, and to output an instruction to supply the predetermined gas to the substrate storage container, when the substrate storage container is loaded into the support unit; and a monitoring unit configured to supply the predetermined gas via the gas supply unit in a state where the substrate storage container is disposed on the support unit and the receiving shelf, based on the instruction, to monitor whether the flow rate of the predetermined gas is equal to or greater than a predetermined reference value, and to stop the supply of the predetermined gas in a state where the substrate storage container is supported by the first transferring mechanism, when the predetermined gas is supplied.

(Supplementary Note 21)

Preferable, the management unit of the substrate processing apparatus according to Supplementary note 20, designates the substrate storage container as being in a faulty state (as a faulty FOUP) when the state of the flow rate of the predetermined gas being less than the predetermined reference value lasts longer than a predetermined monitoring time, and the management unit then prevents the substrate storage container indicated as being in the faulty state (the faulty FOUP) from being loaded into and unloaded from at least one of the support unit and the receiving shelf.

(Supplementary Note 22)

Preferably, the management unit of the substrate processing apparatus of Supplementary note 21, clears the indication of the substrate storage container of being in the faulty state (the faulty FOUP) when the state of the flow rate of the predetermined gas supplied into the faulty FOUP being greater than the predetermined reference value lasts longer than a predetermined time period, and the management unit then permits the substrate storage container to be loaded in and unloaded from at least one of the support unit and the receiving shelf.

(Supplementary Note 23)

Preferably, the monitoring unit of the substrate processing apparatus of Supplementary note 20, determines that the flow rate of the predetermined gas is in abnormal state when the flow rate of the predetermined gas is less than the predetermined reference value, and the monitoring unit outputs: an alarm signal indicating the abnormal state to the management unit; and an alarm recovery signal indicating the recovery from the abnormal state when the flow rate of the predetermined gas becomes greater than predetermined reference value during a predetermined monitoring time.

(Supplementary Note 24)

According to another aspect of the present invention, there is provided a substrate processing apparatus. The substrate processing apparatus includes: a gas supply unit configured to supply a predetermined gas to at least one a support unit and a receiving shelf accommodating a substrate storage container; a monitoring unit configured to supply the predetermined gas via the gas supply unit while the substrate storage container is disposed on at least one of the support unit and the receiving shelf, and monitor whether the flow rate of the predetermined gas supplied via the gas supply unit is equal to or greater than a preset reference value; and a management unit configured to indicate the substrate storage container as being in a faulty state (as a faulty FOUP) when a state of the flow rate of the predetermined gas being less than the preset reference value lasts longer than a predetermined monitoring time, and the management unit is further configured to prevent the faulty FOUP from being loaded into and unloaded from at least one of the support unit and the receiving shelf.

(Supplementary Note 25)

Preferably, the management unit of the substrate processing apparatus of Supplementary note 24, clears the indication of the substrate storage container of being in the faulty state (as a faulty FOUP) when a state of the flow rate of $N_2$ gas supplied into the faulty FOUP being greater than the preset reference value lasts longer than a predetermined time period, and the management unit then permits the substrate storage container to be loaded into and unloaded from at least one of the support unit and the receiving shelf.

(Supplementary Note 26)

In the substrate processing apparatus of Supplementary note 24 or 25, preferably, the management unit determines whether a gas is supplied, based on information at least including whether the predetermined gas is to be supplied among identification information and information regarding the type of a substrate, when the substrate storage container is loaded into the support unit; and controls the monitoring unit to supply the gas into the substrate storage container.

(Supplementary Note 27)

According to another aspect of the present invention, there is provided a non-transitory computer-readable recording medium storing a first flow-rate monitoring program and a second flow-rate monitoring program including a sequence of detecting the flow rate of a gas supplied in a state where a substrate storage container is placed on a support unit and a receiving shelf, and comparing the flow rate of the gas with a predetermined reference value; a sequence of generating an alarm signal when a result of comparison between the flow rate of the gas and the predetermined reference value indicates that the flow rate is less than the predetermined reference value; a sequence of monitoring whether a state where the flow rate is less than the predetermined reference value lasts for a predetermined monitoring time; and a sequence of indicating the substrate storage container as being in a faulty state (as a faulty FOUP) when the state lasts for the predetermined monitoring time or more.

(Supplementary Note 28)

According to another aspect of the present invention, there is provided a non-transitory computer-readable recording medium storing a first flow-rate monitoring program and a second flow-rate monitoring program including a sequence of detecting the flow rate of a gas supplied in a state where a substrate storage container is placed on a support unit and a receiving shelf, and comparing the flow rate of the gas with a predetermined reference value; a sequence of generating an alarm signal when a result of comparison between the flow rate of the gas and the predetermined reference value indicates that the flow rate is less than the predetermined reference value; a sequence of monitoring whether a state where the flow rate is less than the predetermined reference value lasts for a predetermined monitoring time; a sequence of indicating the substrate storage container as being in a faulty state (as a faulty FOUP) when the state lasts for the predetermined monitoring time or more; and a sequence of clearing the faulty state of the substrate storage container (as a faulty FOUP) when a state where the flow rate of the gas in the substrate storage container indicated as being in the faulty state (as a faulty FOUP) is greater than the predetermined reference value lasts longer than a predetermined recovery time.

(Supplementary Note 29)

According to another aspect of the present invention, there is provided a substrate processing apparatus including a gas supply unit configured to supply a gas to at least one of a support unit and a receiving shelf on which a substrate storage container is disposed; a first transferring mechanism configured to transfer the substrate storage container between the support unit and the receiving shelf; a management unit configured to determine at least information indicating whether purging is to be scheduled and to manage information including identification information, information regarding the type of a substrate, and the information indicating whether purging is to be scheduled, when the substrate storage container is loaded into the support unit; and a monitoring unit configured to supply a predetermined gas via the gas supply unit based on the information in a state where the substrate storage container is disposed at least one of the support unit and the receiving shelf, and to monitor whether the flow rate of the predetermined gas supplied via the gas supply unit is equal to or greater than a preset reference value, wherein the management unit enables to select a first control operation and a second control operation, wherein in the first control operation, the substrate storage container is indicated as being in a faulty state (as a faulty FOUP) when a state where the flow rate of the predetermined gas is less than the preset reference value lasts longer than a predetermined monitoring time elapses, when the purging is to be scheduled, and is prevented from being loaded into or unloaded from the support unit and the receiving shelf, and in the second operation, after the first control operation is performed, the indication of the substrate storage container as being in the faulty state (as a faulty FOUP) is cleared and the substrate storage container is permitted to be loaded into and from the support unit and the receiving shelf when a state where the flow rate of a gas supplied into the substrate storage container indicated as being in the faulty state (as a faulty FOUP) is greater than the preset reference value lasts longer than a predetermined time period.

(Supplementary Note 30)

According to another aspect of the present invention, there is provided a method of monitoring a gas flow rate, the method including a process of outputting a signal indicating that a flow rate of the gas is in an abnormal state when a result of comparison between the flow rate of the gas and a reference value indicates that the flow rate of a supplied gas is less than the reference value in a state where a substrate storage container is placed on a support unit and a receiving unit; a fault indication process of outputting a signal for indicating the substrate storage container as being in a faulty state when a predetermined monitoring time elapses in a state where the flow rate of the gas is less than the reference value; and a process of outputting a signal indicating recovery of a normal flow rate when the predetermined monitoring time has not elapsed in the state where the flow rate of the gas is less than the reference value and the flow rate of the gas becomes greater than the reference value.

(Supplementary Note 31)

According to another aspect of the present invention, there is provided a method of manufacturing a semiconductor device, the method including a process of supplying a predetermined gas into a substrate storage container via a gas supply unit installed in at least one of a support unit and a receiving unit; a process of comparing the flow rate of the predetermined gas supplied into the substrate storage container via the gas supply unit with a preset reference value, and outputting a signal indicating a result of comparison between the flow rate of the predetermined gas and the preset reference value; a process of managing a transfer state of the substrate storage container based on the output signal; and a process of transferring to a process chamber a substrate present in the substrate storage container, the transfer state of which is managed, and processing the substrate.

(Supplementary Note 32)

According to another aspect of the present invention, there is provided a non-transitory computer-readable recording medium storing a flow-rate monitoring program including a sequence of comparing the flow rate of a gas supplied into a substrate storage container placed on at least one of a support unit and a receiving unit with a preset reference value; and a sequence of outputting a signal selected from among a signal for indicating that a flow rate of the gas is in an abnormal state, a signal for indicating recovery from the abnormal state, and a signal for indicting a transfer state of the substrate storage container, based on a signal indicating a result of comparison between the flow rate of the gas and the preset reference value.

(Supplementary Note 33)

According to another aspect of the present invention, there is provided a non-transitory computer-readable recording medium storing a flow-rate monitoring program including a sequence of supplying a gas into a substrate storage container disposed on at least one of a support unit and a receiving unit; a sequence of comparing the flow rate of the gas supplied into the substrate storage container with a preset reference value; a sequence of outputting a signal indicating a result of comparison between the flow rate of the gas and the preset reference value; and a sequence of indicating a transfer state of the substrate storage container based on the signal.

What is claimed is:

1. A substrate processing apparatus comprising:
a gas supply unit configured to supply a gas into a substrate storage container, wherein the gas supply unit is installed in a loading port or a rotary pod shelf where the substrate storage container is placed, the gas supply unit comprising: a position sensor configured to detect whether the substrate storage container is placed on the loading port or the rotary pod shelf; a valve configured to supply the gas therethrough; and a detection unit configured to detect a flow rate of the gas supplied into the substrate storage container;
a substrate storage container transfer device configured to transfer the substrate storage container between the loading port and the rotary pod shelf;
a transfer controller configured to control the substrate storage container transfer device;
a gas supply controller configured to compare the flow rate of the gas supplied into the substrate storage container via the gas supply unit to a preset reference value and to output a signal indicating a result of comparison between the flow rate of the gas and the preset reference value; and
a controller configured to control a transfer state of the substrate storage container by controlling the substrate storage container transfer device via the transfer controller,
wherein the controller is configured to manage a state of the gas in the substrate storage container based on the signal outputted from the gas supply controller, and
the gas supply controller is configured to monitor the flow rate of the gas via the detection unit to determine whether the flow rate of the gas is equal to or higher than the preset reference value while the gas supply unit supplies the gas into the substrate storage container during a period from a loading of the substrate storage container onto the loading port to an unloading of the substrate storage container from the loading port out of the substrate processing apparatus,
wherein the controller is configured to:
receive instruction data, said instruction data including a carrier ID of the substrate storage container and a type of substrate accommodated in the substrate storage container and a purging schedule; based on said instruction data said controller is further configured to:
instruct the transfer controller to start loading the substrate storage container,
identify the substrate storage container based on the carrier ID included in the instruction data,
determine whether the substrate storage container, which has arrived at the loading port, is identical to the substrate storage container instructed to be loaded, and
control the gas supply controller to start purging the substrate storage container placed on the loading port.

2. The substrate processing apparatus of claim 1, wherein the gas supply controller is configured to determine a state of the substrate storage container to be faulty when a gas flow state, in which the flow rate of the gas is less than the preset reference value, lasts longer than a first monitoring time period.

3. The substrate processing apparatus of claim 2, wherein the gas supply controller is configured to determine a faulty state of the substrate storage container to be cleared when a gas flow state, in which the flow rate of the gas is greater than the preset reference value, lasts longer than a second monitoring time period.

4. The substrate processing apparatus of claim 1, wherein the gas supply controller is configured to: determine a state of the substrate storage container to be faulty when a gas flow state, in which the flow rate of the gas is less than the preset reference value, lasts longer than a first monitoring time period; and determine that the flow rate of the gas is recovered when the flow rate of the gas is greater than the preset reference value before the first monitoring time period elapses.

5. The substrate processing apparatus of claim 1, wherein the controller is further configured to output to the gas supply controller an instruction to supply an inert gas into the substrate storage container placed on the loading port or the rotary pod shelf according to a type of a substrate accommodated in the substrate storage container.

6. The substrate processing apparatus of claim 1, wherein the controller is further configured to output an instruction to the gas supply controller to supply the gas to the substrate storage container depending on information at least indicating whether to supply the gas into the substrate storage container, and the gas supply controller is further configured to: supply the gas to the substrate storage container based on the instruction when the substrate storage container is placed on the loading port or the rotary pod shelf; and stop supplying the gas when the substrate storage container is supported by the substrate storage container transfer device after the substrate storage container is unloaded from the loading port or the rotary pod shelf.

7. The substrate processing apparatus of claim 6, wherein, when the instruction to supply the gas is outputted, the controller is further configured to: designate the substrate storage container as being in a faulty state when a state of the flow rate of the gas being less than the preset reference value lasts longer than a first monitoring time period; and inhibit the substrate storage container indicated as being in the faulty state from being loaded onto and unloaded from the loading port or the rotary pod shelf.

8. The substrate processing apparatus of claim 6, wherein, when the instruction to supply the gas is outputted, the controller is further configured to: clear an indication of the faulty state of the substrate storage container when a state of the flow rate of the gas being greater than the preset reference value lasts longer than a second monitoring time period; and permit the substrate storage container to be loaded onto and unloaded from the loading port or the rotary pod shelf.

9. The substrate processing apparatus of claim 1, wherein the controller is further configured to output an instruction to: supply an inert gas into the substrate storage container when a type of a substrate accommodated in the substrate storage container is a product substrate, and not supply the inert gas into the substrate storage container when the type of the substrate accommodated in the substrate storage container is a dummy substrate.

10. The substrate processing apparatus of claim 1, wherein the controller is further configured to monitor whether the flow rate of the gas is equal to or higher than the preset reference value while the gas supply unit supplies the gas into the substrate storage container in association with a moving operation of the substrate storage container by the transfer storage transfer device.

11. The substrate processing apparatus of claim 1, wherein the controller is further configured to monitor whether the flow rate of the gas is equal to or higher than the preset reference value while the gas supply unit supplies the gas into the substrate storage container in association with pick-up operation and placing operation of the substrate storage container.

* * * * *